US012622263B2

(12) United States Patent
Lee et al.

(10) Patent No.: US 12,622,263 B2
(45) Date of Patent: May 5, 2026

(54) FORMING DIELECTRIC FILM WITH HIGH RESISTANCE TO TILTING

(71) Applicant: Taiwan Semiconductor Manufacturing Co., Ltd., Hsinchu (TW)

(72) Inventors: Ming-Tsung Lee, Hsinchu (TW); Yi-Wen Pan, New Taipei City (TW); Tzu-Nung Lu, Taoyuan City (TW); You-Lan Li, Hsinchu (TW); Chung-Chi Ko, Nantou (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 565 days.

(21) Appl. No.: 17/651,990

(22) Filed: Feb. 22, 2022

(65) Prior Publication Data

US 2023/0154852 A1 May 18, 2023

Related U.S. Application Data

(60) Provisional application No. 63/264,196, filed on Nov. 17, 2021.

(51) Int. Cl.
*H01L 23/532* (2006.01)
*H01L 21/768* (2006.01)
*H01L 23/522* (2006.01)

(52) U.S. Cl.
CPC .... *H01L 23/5329* (2013.01); *H01L 21/76804* (2013.01); *H01L 21/7682* (2013.01); *H01L 21/76877* (2013.01); *H01L 23/5226* (2013.01)

(58) Field of Classification Search
CPC ............. H01L 23/5329; H01L 23/5226; H01L 23/5222; H01L 23/53295; H01L 23/481;
(Continued)

(56) References Cited

U.S. PATENT DOCUMENTS 6,657,284 B1 12/2003 Li et al.
7,534,696 B2 5/2009 Jahnes et al.
(Continued)

FOREIGN PATENT DOCUMENTS

CN 102543944 A 7/2012
DE 102010030757 A1 1/2012
(Continued)

OTHER PUBLICATIONS

US 2006/0094163 A1, 05/2006, Erturk et al. (withdrawn)

*Primary Examiner* — Natalia A Gondarenko
(74) *Attorney, Agent, or Firm* — Slater Matsil, LLP

(57) ABSTRACT

A method includes depositing a dielectric layer over a substrate, and etching the dielectric layer to form an opening and to expose a first conductive feature underlying the dielectric layer. The dielectric layer is formed using a precursor including nitrogen therein. The method further includes depositing a sacrificial spacer layer extending into the opening, and patterning the sacrificial spacer layer to remove a bottom portion of the sacrificial spacer layer. A vertical portion of the sacrificial spacer layer in the opening and on sidewalls of the dielectric layer is left to form a ring. A second conductive feature is formed in the opening. The second conductive feature is encircled by the ring, and is over and electrically coupled to the first conductive feature. At least a portion of the ring is removed to form an air spacer.

20 Claims, 32 Drawing Sheets

(58) Field of Classification Search
CPC .......... H01L 21/76804; H01L 21/7682; H01L 21/0214; H01L 21/02167; H01L 21/02211; H01L 21/02219; H01L 21/02271; H01L 21/76801; H01L 21/02214; H01L 21/76843; H01L 21/7685; H01L 21/76807; H01L 21/76849; H01L 21/76834; H01L 2221/1042; H01L 2221/1063; H01L 21/743; H01L 21/76898; H01L 21/486; H01L 21/76877–76883; H01L 21/823475; H01L 21/4846–4867; H01L 21/481; H01L 24/18–25; H01L 24/82; H01L 2224/18–255; H01L 2224/0348; H01L 2224/0391–03916; H01L 2224/1148; H01L 2224/1191–11916; H01L 2224/2748; H01L 2224/2791–27916; H01L 27/10888; H01L 27/1085; H01L 27/10876; H01L 27/10885; H01L 21/76808; H01L 21/76897; H01L 21/32133; H01L 21/31111
USPC .............. 257/774, 384, 758, 645, 646, 651; 438/623, 381, 462, 619, 618, 620, 622, 438/631, 637, 638, 639
See application file for complete search history.

(56) References Cited

U.S. PATENT DOCUMENTS

| | | | |
|---|---|---|---|
| 7,553,756 B2 | 6/2009 | Hayashi et al. | |
| 7,560,375 B2 * | 7/2009 | Filippi .............. | H01L 21/76807 |
| | | | 438/618 |
| 8,399,335 B2 | 3/2013 | Huisinga et al. | |
| 8,941,157 B2 | 1/2015 | Kim et al. | |
| 9,159,609 B2 | 10/2015 | Lee | |
| 10,410,916 B2 | 9/2019 | Hong | |
| 10,472,714 B2 | 11/2019 | Varadarajan | |
| 10,892,235 B2 * | 1/2021 | Huang .................. | H01L 23/522 |
| 2003/0209805 A1 * | 11/2003 | Choi ................. | H01L 21/02274 |
| | | | 257/776 |
| 2004/0232552 A1 | 11/2004 | Wang et al. | |
| 2006/0030128 A1 * | 2/2006 | Bu ...................... | H01L 23/5222 |
| | | | 438/462 |
| 2006/0073695 A1 | 4/2006 | Filippi et al. | |
| 2007/0228571 A1 * | 10/2007 | Yu ..................... | H01L 21/76829 |
| | | | 257/758 |
| 2007/0252282 A1 | 11/2007 | Anderson et al. | |
| 2008/0230847 A1 * | 9/2008 | Furusawa ......... | H01L 21/76832 |
| | | | 257/E23.141 |
| 2011/0204492 A1 * | 8/2011 | Xie ................... | H01L 21/76832 |
| | | | 438/643 |
| 2013/0323930 A1 | 12/2013 | Chattopadhyay et al. | |
| 2014/0308794 A1 * | 10/2014 | Lee ....................... | H01L 23/498 |
| | | | 438/653 |
| 2015/0044865 A1 * | 2/2015 | Chen ................. | H01L 21/76877 |
| | | | 438/618 |
| 2017/0263549 A1 * | 9/2017 | Lee ..................... | H01L 23/5329 |
| 2018/0005876 A1 | 1/2018 | Tung et al. | |
| 2019/0221475 A1 | 7/2019 | Hong et al. | |
| 2020/0066657 A1 | 2/2020 | Huang et al. | |
| 2020/0388693 A1 * | 12/2020 | Gu ......................... | H10D 30/60 |
| 2020/0411415 A1 | 12/2020 | Wu et al. | |
| 2021/0118749 A1 | 4/2021 | Lai | |
| 2022/0310441 A1 * | 9/2022 | Su .................... | H01L 21/7685 |

FOREIGN PATENT DOCUMENTS

| | | |
|---|---|---|
| KR | 20140123639 A | 10/2014 |
| KR | 20190087843 A | 7/2019 |
| KR | 20200127942 A | 11/2020 |
| TW | 200415747 A | 8/2004 |
| TW | 200802710 A | 1/2008 |
| TW | 200805563 A | 1/2008 |
| TW | 201409614 A | 3/2014 |

* cited by examiner

FORMING DIELECTRIC FILM WITH HIGH RESISTANCE TO TILTING

PRIORITY CLAIM AND CROSS-REFERENCE

This application claims the benefit of the following provisionally filed U.S. Patent application: Application No. 63/264,196, filed on Nov. 17, 2021, and entitled "High Mechanical Strength IMD Layer for Air Gap Process on BEOL," which application is hereby incorporated herein by reference.

BACKGROUND

Integrated circuit devices such as transistors are formed on semiconductor wafers. The devices are interconnected through metal lines and vias to form functional circuits, wherein the metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias in a low-k dielectric layer, the low-k dielectric layer is etched to form trenches and via openings. The etching of the low-k dielectric layer may involve forming a patterned hard mask over the low-k dielectric material, and form trenches using the patterned hard mask as an etching mask. Via openings are also formed underlying the trenches. The trenches and the via openings are then filled with a metallic material, which may comprise copper. A Chemical Mechanical Polish (CMP) process is then performed to remove excess portions of the metallic material over the low-k dielectric layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 illustrates some example precursors for forming a dielectric layer in accordance with some embodiments.

FIG. 23 illustrates a precursor including a Si—C—Si bond in accordance with some embodiments.

FIG. 24 illustrates some precursors free from Si—C—Si bonds in accordance with some embodiments.

DETAILED DESCRIPTION

Figure 1:
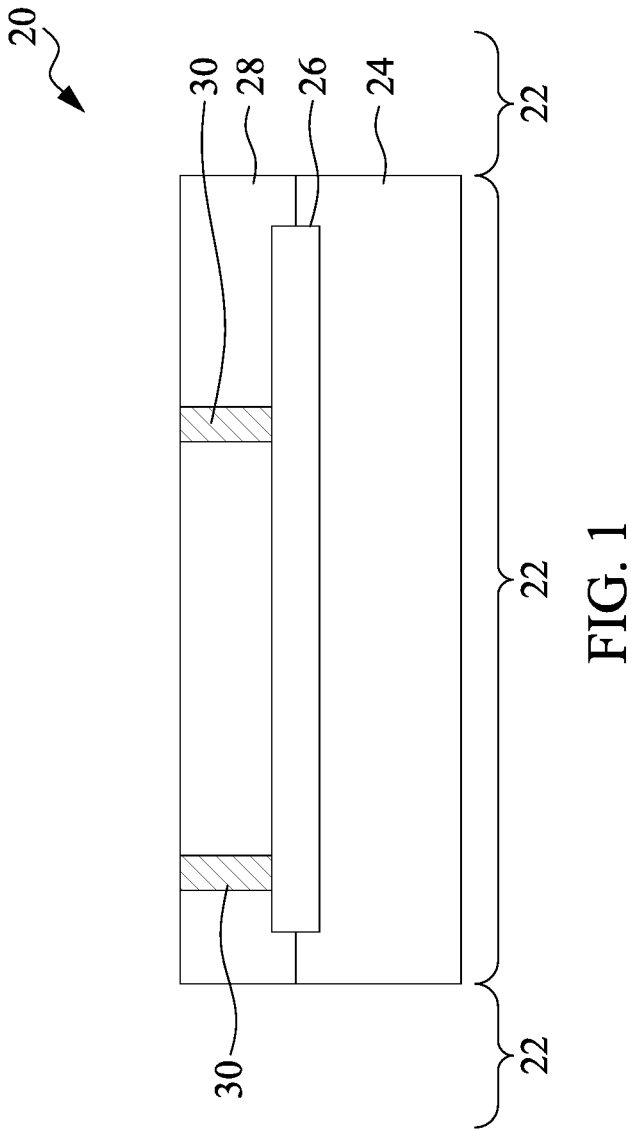
FIGS. 1-8, 9A, 9B, 10-14, and 15A illustrate the cross-sectional views of intermediate stages in the formation of an interconnect structure including air spacers in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure and the method of forming the same are provided. In accordance with some embodiments of the present disclosure, the interconnect structure includes a dielectric layer having improved mechanical strength, which may be formed by adding nitrogen in the dielectric layer. Conductive features are formed in the dielectric layer, and air spacers are formed surrounding the conductive features. With the dielectric layer having improved mechanical strength, the tilting and collapsing of parts of the dielectric layer surrounded by air spacers is reduced. In accordance with alternative embodiments of the present disclosure, the interconnect structure includes a dielectric layer including increased Si—C—Si bonds compared to conventional structures. Accordingly, the depletion of carbon from the dielectric layer is reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-8, 9A, 9B, 10-14, and 15A illustrate the cross-sectional views of intermediate stages in the formation of conductive features and air spacers in accordance with some embodiments of the present disclosure. The corresponding processes are also reflected schematically in the process flow shown in FIG. 28.

FIG. 1 illustrates a cross-sectional view of package component 20. In accordance with some embodiments of the present disclosure, package component 20 is a device wafer including active devices and possibly passive devices, which are represented by the illustrated integrated circuit devices 26. Device wafer 20 may include a plurality of dies 22 therein, with one of dies 22 illustrated. In accordance with alternative embodiments of the present disclosure, package component 20 is an interposer wafer, which may or may not include active devices and/or passive devices. In subsequent discussion, a device wafer is discussed as an example of package component 20. The embodiments of the present disclosure may also be applied to other types of package components such as interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of crystalline silicon, crystalline germanium, silicon germanium, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may be (or may not be) formed to extend into semiconductor substrate 24, wherein the through-vias are used to electrically inter-couple the features on opposite sides of wafer 20.

Figure 25:
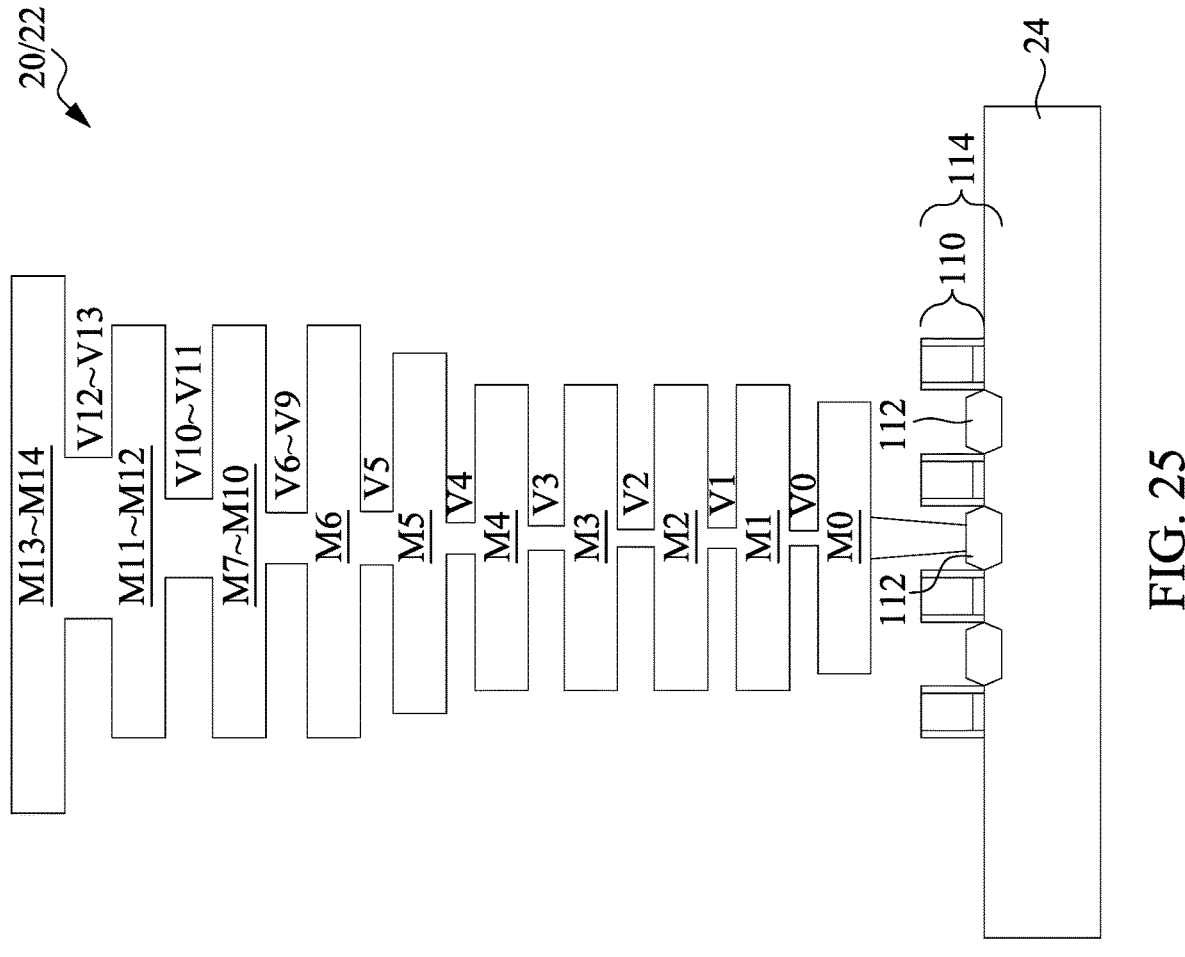
FIG. 25 illustrates the schematic view of layers in a wafer in accordance with some embodiments.

In accordance with some embodiments of the present disclosure, integrated circuit devices 26 are formed at the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated in FIG. 1. FIG. 25 illustrates a schematic view of an example transistor in accordance with some embodiments, which includes gate stacks 110 and source/drain regions 112, which are formed at the top surface of semiconductor substrate 24. In accordance with alternative embodiments, wafer 20 is used for forming interposers, and substrate 24 may be a semiconductor substrate or a dielectric substrate.

Inter-Layer Dielectric (ILD) 28 is formed over semiconductor substrate 24, and fills the space between the gate stacks of transistors (not shown) in integrated circuit devices 26. In accordance with some embodiments, ILD 28 is formed of or comprises Phospho Silicate Glass (PSG), Boro Silicate Glass (BSG), Boron-doped Phospho Silicate Glass (BPSG), Fluorine-doped Silicate Glass (FSG), silicon oxide, or the like. ILD 28 may be formed using spin coating, Flowable Chemical Vapor Deposition (FCVD), or the like. In accordance with some embodiments of the present disclosure, ILD 28 is formed using a deposition process such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process such as a Chemical Mechanical Polish (CMP) process or a mechanical grinding process to level the top surfaces of contact plugs 30 with the top surface of ILD 28.

Figure 2:
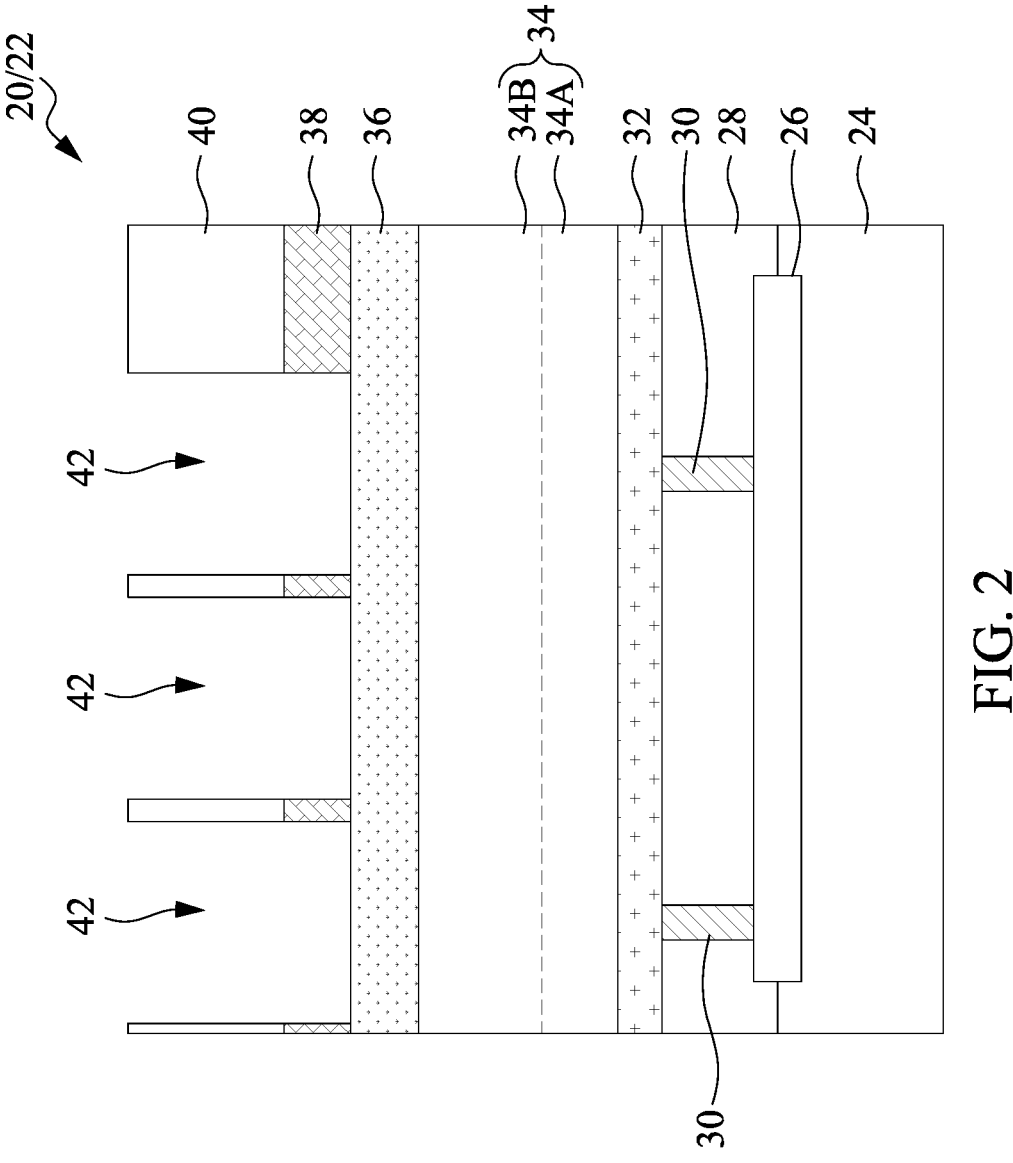
Figure 28:
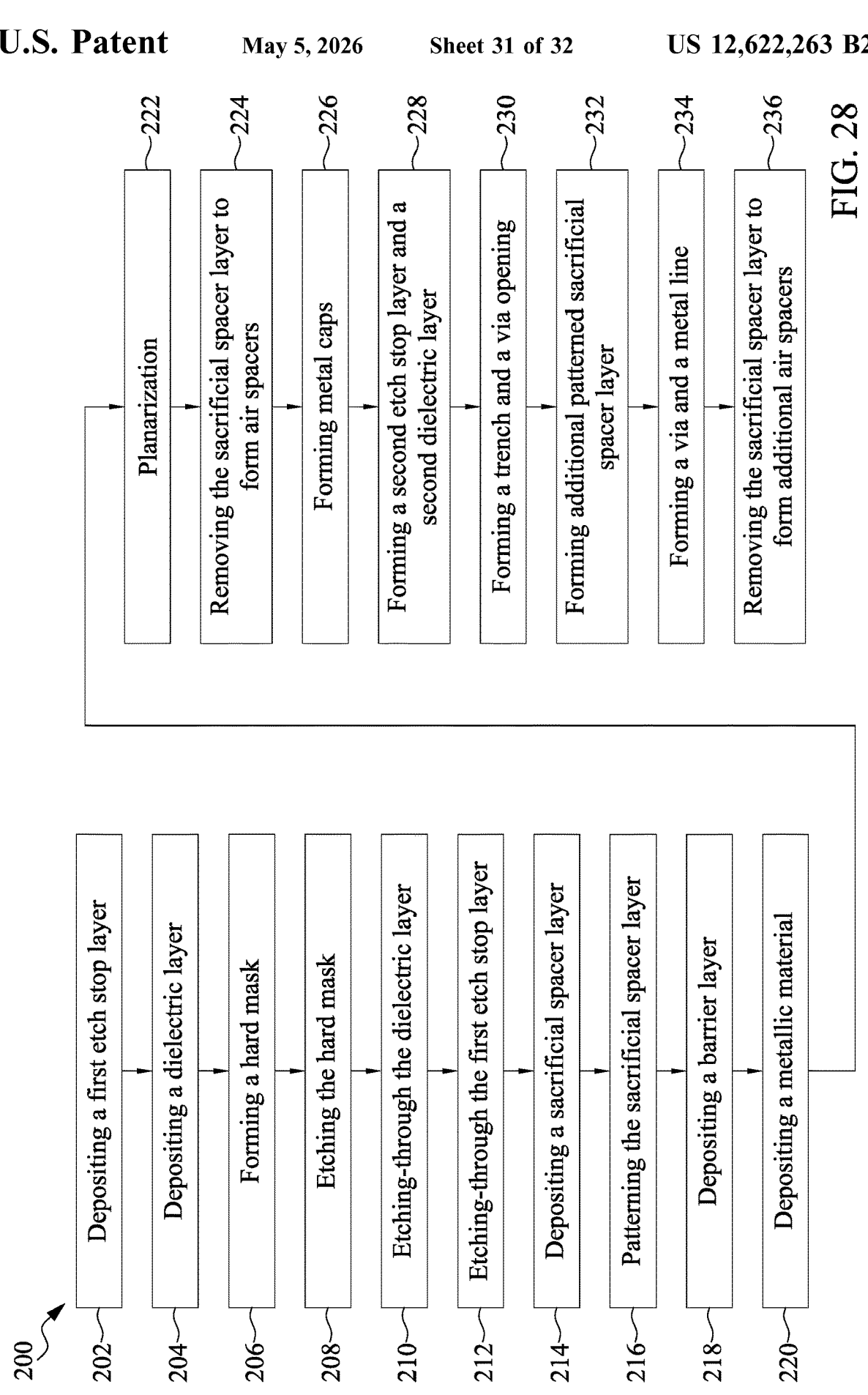
FIG. 28 illustrates a process flow for forming conductive features and air spacers in accordance with some embodiments.

Referring to FIG. 2, etch stop layer 32 is formed over ILD 28 and contact plugs 30. The respective process is illustrated as process 202 in the process flow 200 as shown in FIG. 28. In accordance with some embodiments, etch stop layer 32 is in contact with the top surfaces of ILD 28 and contact plugs 30. In accordance with alternative embodiments, there is one or a plurality of layers and the corresponding features located between ILD 28 and etch stop layer 32. For example, there may be an additional etch stop layer(s), an additional ILD, low-k dielectric layers, etc., between ILD 28 and etch stop layer 32. Correspondingly, there may be contact plugs, vias, metal lines, etc., in the dielectric layers.

Etch stop layer 32 may include silicon nitride (SiN), silicon carbide (SiC), silicon oxy-nitride (SiON), silicon oxy-carbide (SiOC), silicon Carbo-nitride (SiCN), or the like. Etch stop layer 32 may also include a metal oxide, a metal nitride, or the like. Etch stop layer 32 may be a single layer formed of a homogeneous material, or a composite layer including a plurality of dielectric sub-layers formed of different martials. In accordance with some embodiments of the present disclosure, etch stop layer 32 includes an aluminum nitride (AlN) layer, a silicon oxy-carbide layer over the aluminum nitride layer, and an aluminum oxide layer over the silicon oxy-carbide layer.

Further referring to FIG. 2, dielectric layer 34 is deposited over etch stop layer 32. The respective process is illustrated as process 204 in the process flow 200 as shown in FIG. 28. In accordance with some embodiments, dielectric layer 34 is also an ILD layer. In accordance with alternative embodiments, dielectric layer 34 is an Inter-Metal Dielectric (IMD) layer for forming metal lines.

In accordance with some embodiments, dielectric layer 34 is formed to have a great hardness, for example, greater than about 10 GPa, and may be in the range between about 15 GPa and about 35 GPa, which hardness value may be measured by using a nanoindenter. As will be discussed in subsequent paragraphs, forming dielectric layer 34 with high hardness value may improve the reliability of the interconnect structure and reduces the RC delay (by incorporating wide air spacers) of the features formed in dielectric layer 34. The dielectric constant (k value) of dielectric layer 34 may be in the range between about 3.0 and about 4.5. Accordingly, dielectric layer 34 may be a low-k dielectric layer or a high-k dielectric layer, or the k value of dielectric layer 34 may be equal to the k value of silicon oxide, whose k value is the dividing value of high-k and low-k.

In accordance with some embodiments, to increase the hardness value of dielectric layer 34, dielectric layer 34 is formed of or comprises a nitrogen-doped dielectric such as a nitrogen-doped silicon oxide (SiON) or nitrogen-doped silicon carbide (SiCN). Adding nitrogen into dielectric layer 34 results in the increase in its hardness value, so that the reliability and RC delay performance can be improved. On the other hand, the k value of dielectric layer 34 is adversely increased due to the adding of nitrogen. The increase in the k value, however, may be compensated for by the formation of wide air spacers.

In accordance with some embodiments, the formation of dielectric layer 34 may be performed using Plasma Enhance Chemical Vapor Deposition (PECVD), Sub Atmospheric Chemical Vapor Deposition (SACVD), Atomic Layer deposition (ALD), or the like. The precursors may include a first precursor that is free from nitrogen therein, and a second precursor that includes nitrogen. The first precursor provides the main elements and main structures for dielectric layer 34. Doping nitrogen through a second precursor has the advantageous feature of adding nitrogen, and hence improves hardness, without causing significant increase in k value. This is because by adding nitrogen through the second precursor, the bonds of nitrogen to the elements in the main materials are fewer.

Figure 16:
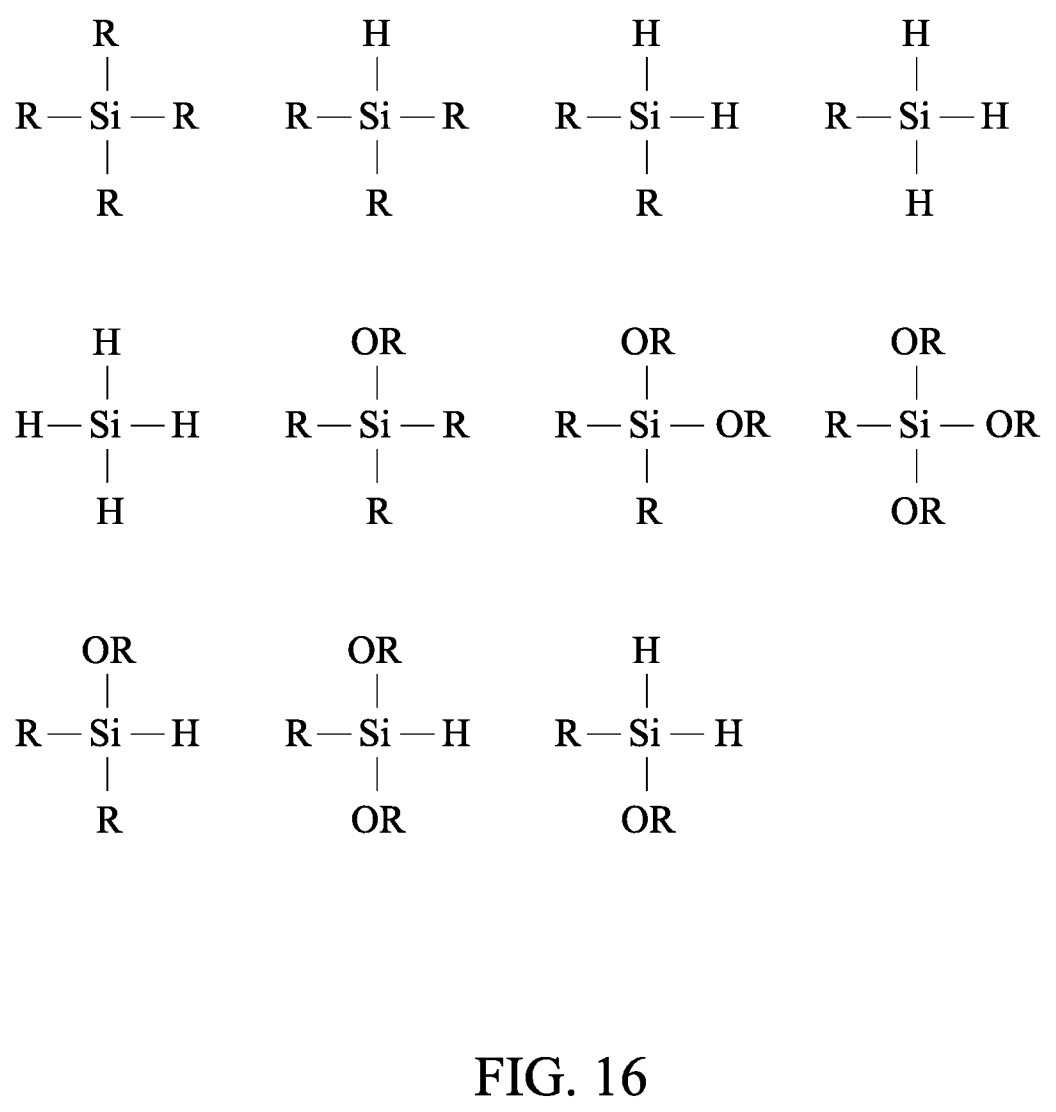

Some examples of the first precursor are listed in FIG. 16. In accordance with some embodiments, the first precursor may include a Si atom(s), and carbon atoms and hydrogen atoms in addition to the silicon atom(s). The carbon atoms and hydrogen atoms may be in the form of one or more functional group denoted as R or "OR" (with oxygen ("O") bonded with functional group R). Functional group R may be selected from $CH_3$, $C_2H_5$, or the like. The second precursor, which is nitrogen-comprising, may include $NH_3$, $N_2$, $N_2O$, or the like, or combinations thereof. The second precursor may further include $CO_2$ in addition to the nitrogen-containing precursor. In accordance with some embodiments, the formation process includes PECVD, wherein the flow rate of the precursors may be in the range between about 30 sccm and about 1,500 sccm, and/or in the range between about 200 mgm and about 2,000 mgm. The deposition temperature may be in the range between about 200° C. and about 450° C. The deposition rate may be in the range between about 2 Å/second and about 20 Å/second. In the resulting dielectric layer 34, nitrogen atomic percentage may be in the range between about 0.5 percent and about 12 percent, which may be measured using X-ray Photoelectron Spectroscopy (XPS).

In accordance with some embodiments, to improve the hardness of dielectric layer 34, in the deposition of dielectric layer 34, no porogen is added, and accordingly, the resulting dielectric layer 34 do not include pores. Furthermore, the tilting and collapsing of stripped portions of dielectric layer 34 occurs on narrow and tall dielectric strips (as can be seem in FIG. 9A). To minimize the k value while still maintain the mechanical strength of dielectric layer 34, a first portion (such as the upper portion 34B, for example, the upper half or upper ¾) of dielectric layer 34 may have an increased nitrogen atomic percentage than a second portion (such as the lower portion 34A, for example, the lower half or lower ¼). This may be achieved by increasing the flow rate of the second precursor (nitrogen-containing) when depositing the first portion. By increasing the nitrogen atomic percentage of a portion, but not all, of dielectric layer 34, the narrow strips are less likely to tilt or collapse, while the overall RC delay is increased less.

Conversely, the first portion (with the increased nitrogen atomic percentage) may be a lower portion, while the second portion may be an upper. In accordance with alternative embodiments, the first portion is the middle portion, while the second portion includes a top portion and a bottom portion.

Furthermore, assuming the first portion is a bottom portion, in accordance with some embodiments, starting at a certain point of the deposition of dielectric layer 34, the flow rate of the nitrogen-containing precursor may be increased continuously or increased by stages. The certain point may be the beginning of the deposition of dielectric layer 34, or may be an intermediate point (such as after ¼ or a half of dielectric layer 34 has been deposited). Before the certain point, the flow rate of the nitrogen-containing precursor may be a constant. Furthermore, to increase the nitrogen atomic percentage of the upper portions, instead of increasing the flow rate of the nitrogen-containing precursor, the first precursor (non-nitrogen-containing) may be reduced.

In accordance with alternative embodiments, after the deposition of dielectric layer 34, which may have a uniformly or non-uniformly nitrogen atomic percentage, the nitrogen atoms may be implanted into dielectric layer 34. The implanted species may also include $NH_3$, $N_2$, $N_2O$, or the like, or combinations thereof. The implanted nitrogen atoms have a smaller chance of being bonded to atoms such as silicon or carbon, and hence the hardness of dielectric layer 34 is improved without significantly increasing its k value. Whether to implant nitrogen into the top portion, the middle portion, or the bottom portion of dielectric layer 34 may be achieved by adjusting the implantation energy.

Pad layer 36 and hard mask 38 are then formed on dielectric layer 34. The respective process is illustrated as process 206 in the process flow 200 as shown in FIG. 28. Pad layer 36 may be a thin film formed of or comprising silicon oxide. In accordance with some embodiments of the present disclosure, pad layer 36 is formed using Tetraethyl orthosilicate (TEOS) as a precursor, and the deposition process may include PECVD, CVD, or the like. Pad layer 36 acts as an adhesion layer between dielectric layer 34 and hard mask 38. Pad layer 36 may also act as an etch stop layer for etching hard mask 38. In accordance with some embodiments of the present disclosure, hard mask 38 is formed of silicon nitride, for example, using Low-Pressure Chemical Vapor Deposition (LPCVD). In accordance with other embodiments of the present disclosure, hard mask 38 is formed of or comprises tungsten doped carbide (WDC), titanium nitride, boron nitride, or the like, which may be formed through PECVD, for example. Hard mask 38 is used as a hard mask during subsequent photolithography processes.

Further referring to FIG. 2, photo resist 40 is formed on hard mask 38 and is then patterned, forming openings 42 in photo resist 40. In a subsequent process, photo resist 40 is used to etch hard mask layer 36. The respective process is illustrated as process 208 in the process flow 200 as shown in FIG. 28. Pad layer 36 may act as the etch stop layer for the etching process. Accordingly, pad layer 36 is exposed. After the etching process, photo resist 40 is removed, for example, in an ashing process.

Figure 3:
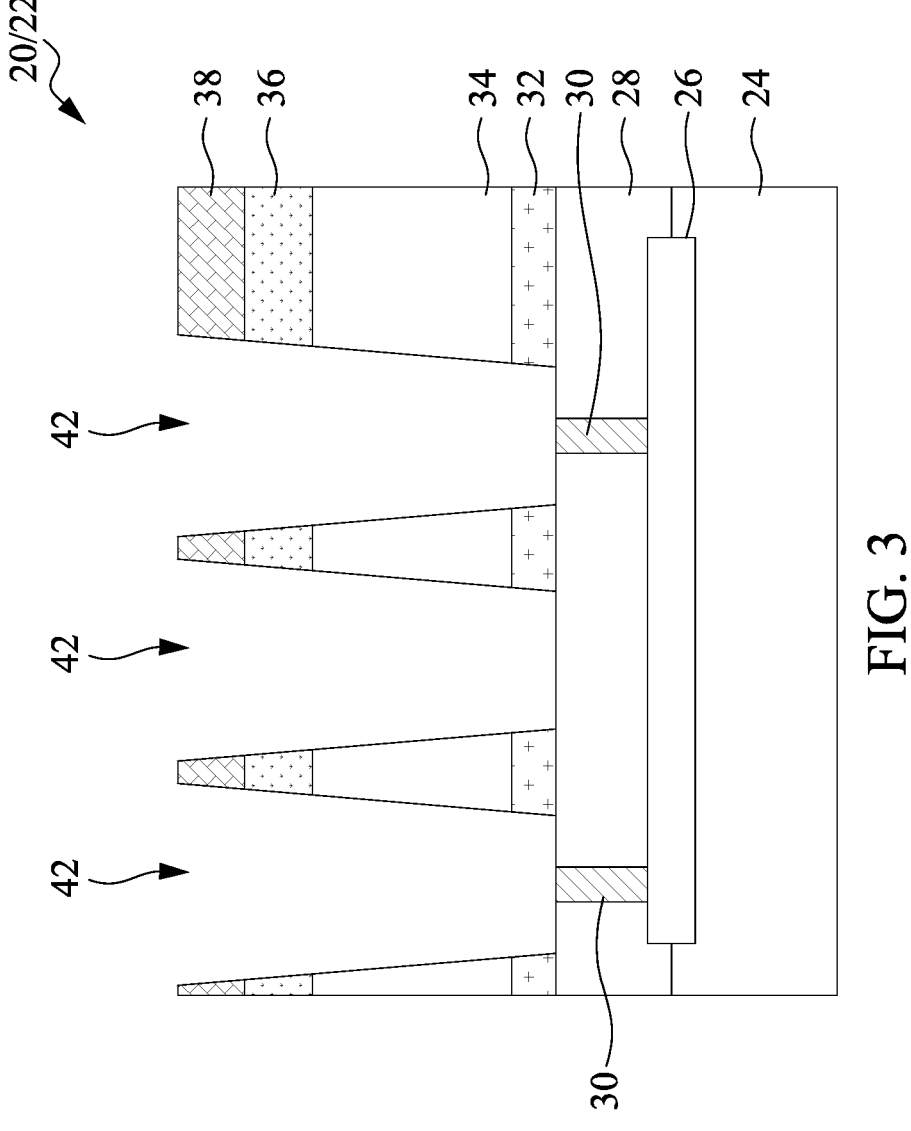

Next, referring to FIG. 3, pad layer 36 and dielectric layer 34 are etched using hard mask 38 as an etching mask, and openings 42 extend into dielectric layer 34. The respective process is illustrated as process 210 in the process flow 200 as shown in FIG. 28. The pad layer 36 may be etched through a dry etching process by using a mixture of $NF_3$ and $NH_3$ gases, the mixture of HF and $NH_3$ gases, or the like. Alternatively, pad layer 36 may be etched through a wet etching process by using, for example, an HF solution. In accordance with some embodiments of the present disclosure, the etching of dielectric layer 34 is performed using a process gas comprising fluorine and carbon, wherein fluorine is used for etching, with carbon having the effect of protecting the sidewalls of the dielectric layer 34, with the sidewalls facing via openings and trenches. For example, the process gases for the etching include a fluorine and carbon containing gas(es) such as $C_4F_8$, $CH_2F_2$, $CH_4$, $CH_3F$, and/or $CF_4$, and a carrier gas such as Ar, $N_2$, or the like. The etching is anisotropic.

The etching of dielectric layer 34 stops on etch stop layer 32. Next, etch stop layer 32 is etched-through, and openings 42 further penetrate through etch stop layer 32. The respective process is illustrated as process 212 in the process flow 200 as shown in FIG. 28. The etching chemical is selected according to the materials and the layers of etch stop layer 32. For example, when etch stop layer 32 comprises aluminum oxide, silicon oxycarbide, aluminum nitride, etc., etching gases such as $BCl_3$, $Cl_2$, $CF_4$, $CHF_3$, etc. may be used, and oxygen ($O_2$) may be added. After the etching of dielectric layer 34, the underlying conductive features (such as contact plugs 30 when etch stop layer 32 is immediately over contact plugs 30) are revealed.

Figure 4:
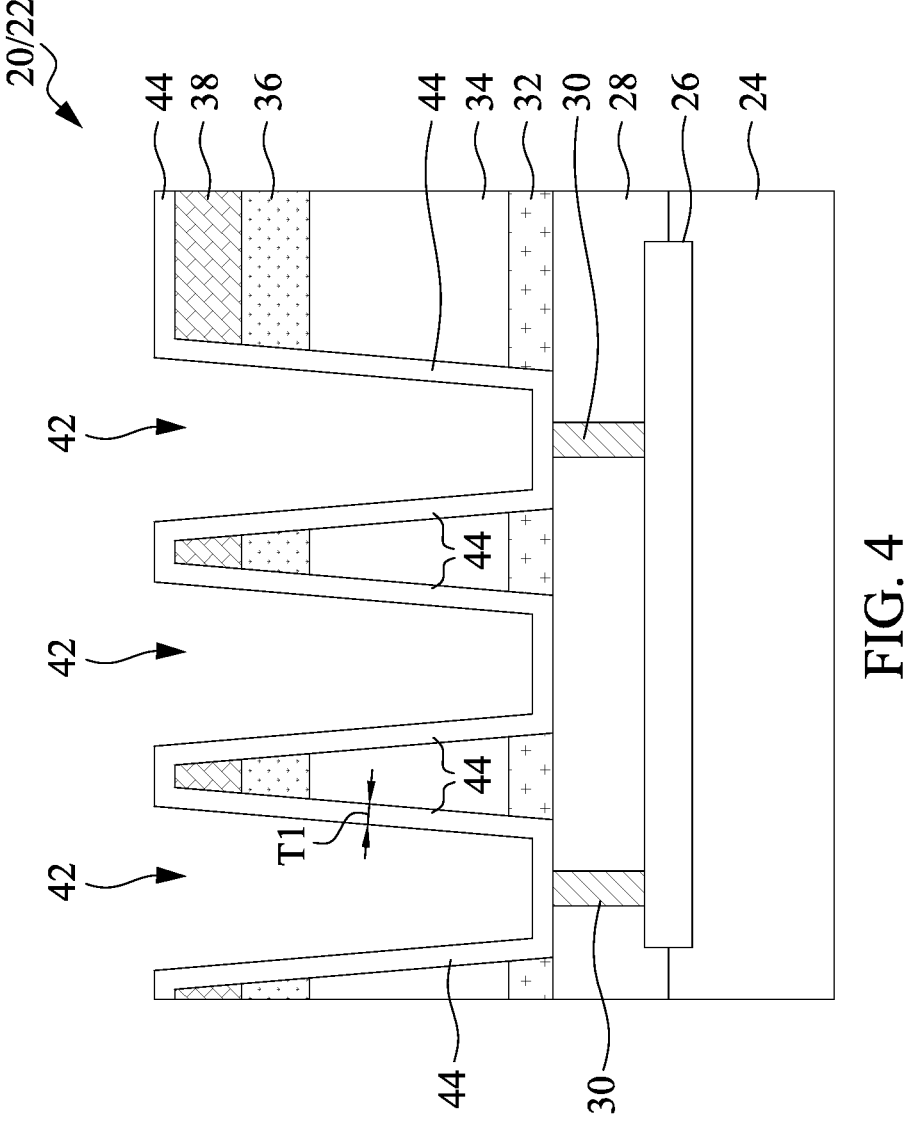

FIG. 4 illustrates the deposition of sacrificial spacer layer 44. The respective process is illustrated as process 214 in the process flow 200 as shown in FIG. 28. In accordance with some embodiments, sacrificial spacer layer 44 is formed of or comprises a semiconductor such as Si, or a dielectric material, which may be an oxide (such as titanium oxide (TiOx) or aluminum oxide (AlOx)), a nitride (such as silicon nitride), or the like. The thickness T1 of sacrificial spacer layer 44 is able to be increased due to the greater hardness value of dielectric layer 34. In accordance with some embodiments, thickness T1 is greater than about 5 Å, and may be in the range between about 5 Å and about 30 Å. With nitrogen added into dielectric layer 34, dielectric layer 34 is stronger, and thickness T1 may be greater than about 30 Å. The deposition may be performed through a conformal deposition process such as CVD, ALD, PECVD, Physical Vapor Deposition (PVD), or the like.

It is also appreciated that the thickness T1 is related to the position of dielectric layer 34. For example, when dielectric layer 34 is a lower IMD layer such as the layer for metallization layer M0, M1, etc., thickness T1 may be smaller, and when dielectric layer 34 is a higher IMD layer such as the layer for metallization layer M8, M9 or higher, thickness T1 may be greater.

Figure 5:
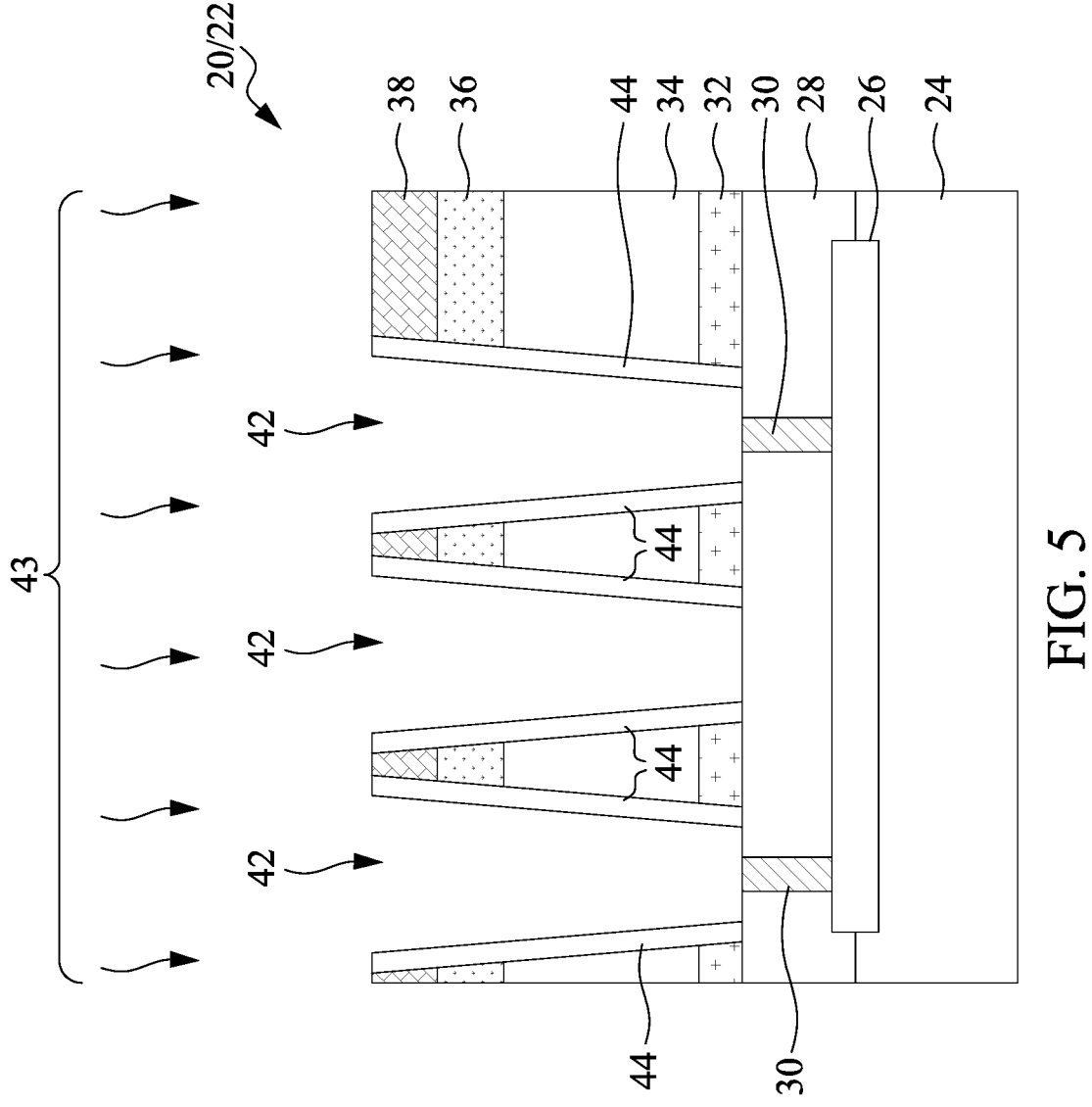

FIG. 5 illustrates an anisotropic etching process 43 for patterning sacrificial spacer layer 44. The respective process is illustrated as process 216 in the process flow 200 as shown in FIG. 28. In accordance with some embodiments, the etching is performed through a dry etching process, wherein the etching gas may include $Cl_2$, $CF_4$, $CHF_3$, $CH_4$, HBr, $O_2$, etc., depending on the material of the sacrificial spacer layer 44. As a result of the anisotropic etching process, the horizontal portions of sacrificial spacer layer 44 are removed. Furthermore, at the bottoms of openings 42, contact plugs 30 are exposed. The vertical portions of sacrificial spacer layer 44 are left in openings 42, and are on the sidewalls of etch stop layer 32, dielectric layer 34, pad layer 36, and hard mask 38.

Figure 6:
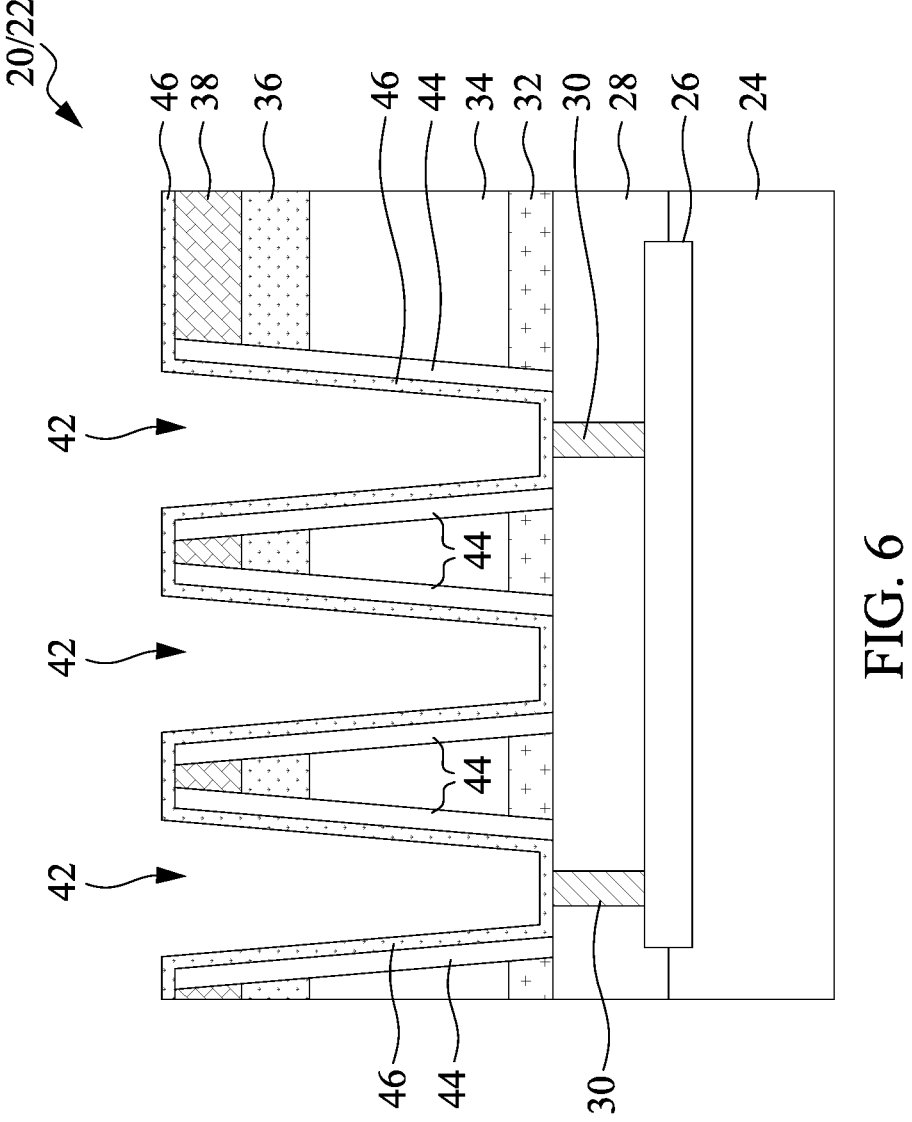
Figure 7:
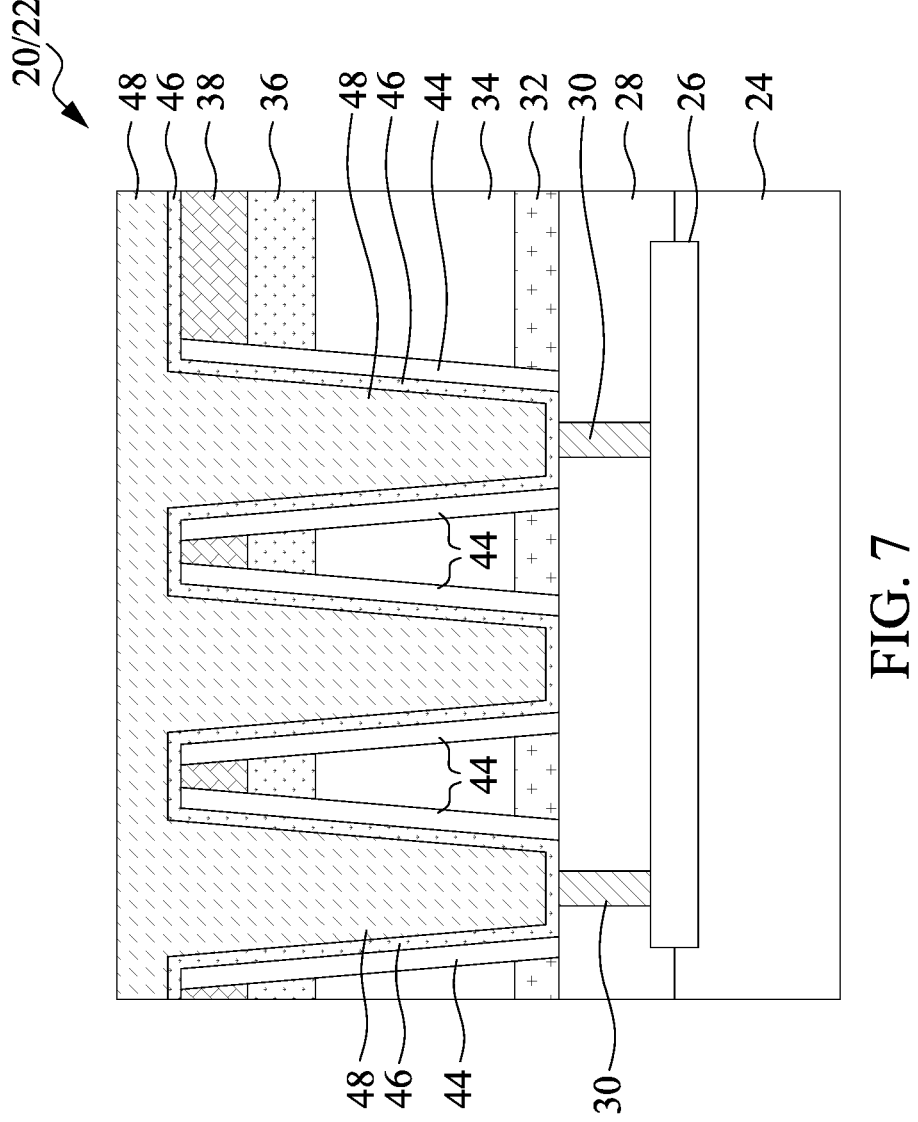
Figure 8:
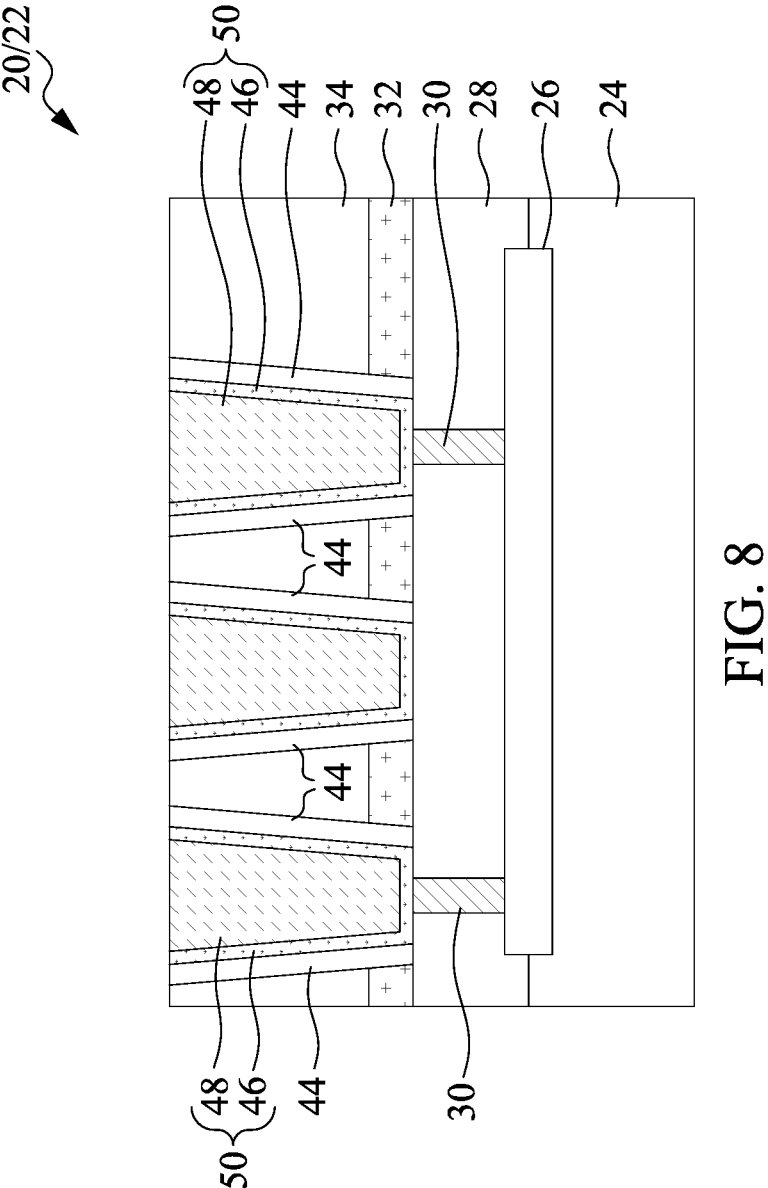

FIGS. 6 through 8 illustrate the formation of conductive features 50 (FIG. 8). Referring to FIG. 6, barrier layer 46 is formed. The respective process is illustrated as process 218 in the process flow 200 as shown in FIG. 28. In accordance with some embodiments, barrier layer 46 is formed of or comprises titanium, titanium nitride, tantalum, tantalum nitride, or the like. There may also be a metal seed layer (not shown) formed over barrier layer 46. The seed layer may include copper doped with Mn, for example, with an atomic percentage of Mn in the range between about 0.1 percent and about 2 percent. Barrier layer 46 and the seed layer may be formed as conformal layers, which may be formed using PVD, CVD, ALD, or the like. The metal seed layer may be formed of or comprise copper, and may be formed, for example, using PVD. The barrier thickness and the metal seed thickness may be in the range between about 5 Å and about 20 Å.

FIG. 7 illustrates the deposition of conductive material 48. The respective process is illustrated as process 220 in the process flow 200 as shown in FIG. 28. In accordance with some embodiments, conductive material 48 comprises copper or a copper alloy, cobalt, tungsten, aluminum, or the like, or combinations thereof. The deposition process may include Electro Chemical Plating (ECP), electroless plating, CVD, PVD, ALD, or the like. Conductive material 48 fully fills openings 42.

Next, a planarization process such as a Chemical Mechanical Polish (CMP) process or a mechanical grinding process is performed to remove excess portions of the conductive material 48 and barrier layer 46. The respective process is illustrated as process 222 in the process flow 200 as shown in FIG. 28. The planarization process may be stopped on the top surface of dielectric layer 34, or on the top surface of pad layer 36. The planarization process may also be performed to remove a top portion of dielectric layer 34. The resulting structure is shown in FIG. 8. Throughout the description, the remaining portions of conductive material 48 and barrier layer 46 are collectively referred to as conductive features 50, which may be metal lines, metal vias, contact plugs, etc. Spacer rings 44 surround the corresponding conductive features 50.

Figure 9A:
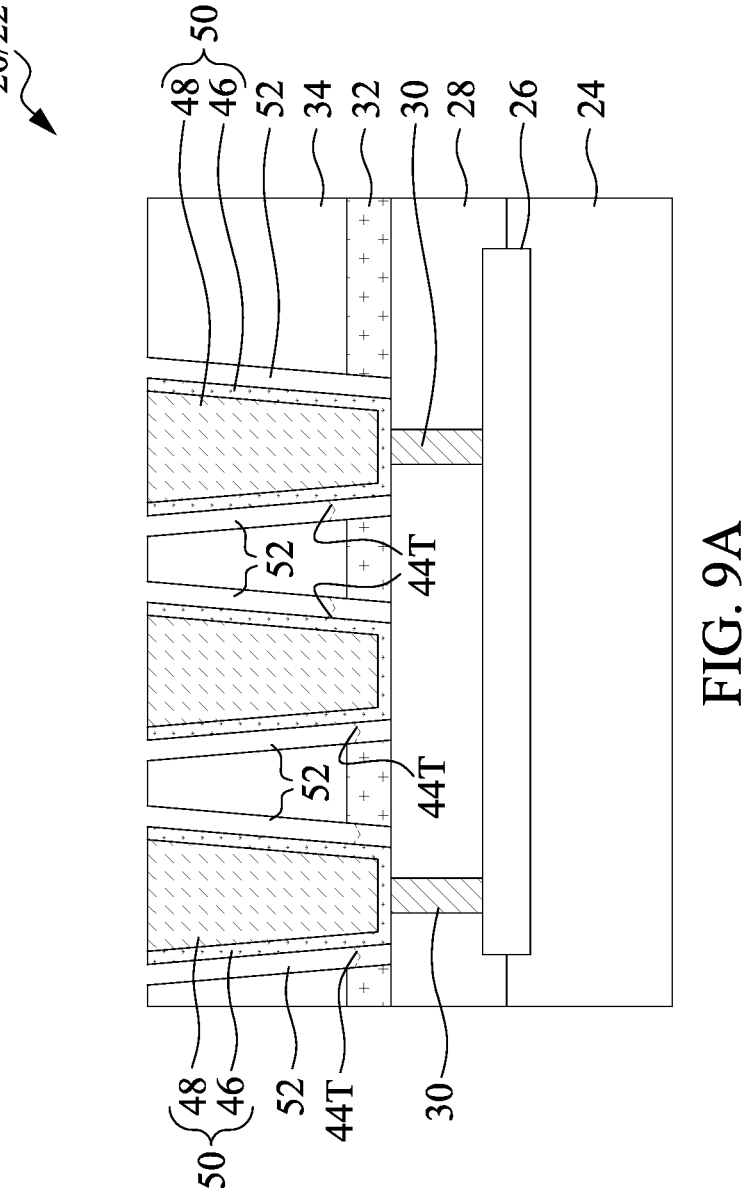

FIG. 9A illustrates the removal of sacrificial spacer layers 44 to form air spacers 52. The respective process is illustrated as process 224 in the process flow 200 as shown in FIG. 28. Air spacers 52 have substantially uniform thickness (lateral dimension) due to the conformity of sacrificial spacer layer 44, for example, with the thicknesses of most parts of an air spacer having a variation smaller than about 20 percent. In accordance with some embodiments, sacrificial spacer layer 44 is etched using an isotropic etching process, which may include a dry etching process and/or a wet etching process. For example, when a dry etching process is performed, the etching gas may include HF, $NF_3$, $O_2$, $H_2$, $NH_3$, $Cl_2$, $CF_4$, $CHF_3$, $CH_4$, HBr, or the like, or combinations thereof, depending on the material of the sacrificial spacer layer 44. When a wet etching process is performed, the etching chemical may include a HF solution, ammonia water ($NH_4OH$), or the like. The etching may also be performed using a wet etching process combined with a dry etching process.

In accordance with some embodiments, sacrificial spacer layer 44 is fully removed, and air spacers 52 extend to the top surface of the underlying dielectric layer (such as ILD 28, depending on the position of dielectric layer 34). It is also possible that the process variation and the high aspect ratio of air spacers 52 may cause sacrificial spacer layer 44 to be partially removed. For example, the bottom portions of sacrificial spacer layer 44 may remain un-removed after the removal process, and dashed lines 44T represent the top surfaces of the residue of sacrificial spacer layer 44. The residue portions of sacrificial spacer layer 44 may form a full ring encircling conductive features 50. Also due to process variation and the non-uniformity in the removal, the sacrificial spacer layer 44 surrounding some of the conductive features 50 may be fully removed, while the sacrificial spacer layer 44 surrounding some other conductive features 50 may have residues left. Furthermore, there may be some portions of the corresponding spacer layer 44 fully removed, and the underlying ILD 28 exposed, while some other portions of the same spacer layer 44 surrounding the same conductive feature 50 are left as residue sacrificial spacer layer.

An example is schematically illustrated in FIG. 9A, which shows that residue sacrificial spacer layer 44 exists on the left side of the rightmost conductive feature 50, while the portion of sacrificial spacer layer 44 on the right side of the rightmost conductive feature 50 is fully removed. Also, the different portions of residue sacrificial spacer layer 44 surrounding the same conductive feature 50 or different conductive features 50 may have their top surfaces at different levels, as indicated in the examples as shown in FIG. 9A. It is appreciated that the above-discussed air spacers 52 and residue sacrificial spacer layer 44 may exist on the same wafer and same die 22.

It is appreciated that the strips of dielectric layer 34 between air spacers 52 may be narrow and tall, and hence may suffer from tilting and collapsing. In accordance with some embodiments of the present disclosure, by increasing the hardness value of dielectric layer 34, the tilting and collapsing may be reduced and possibly eliminated. Furthermore, with the dielectric layer 34 have a greater hardness value, the widths of air spacers 52 may be increased without the concern of dielectric tilting and collapsing, resulting in further reduction in the RC delay. In the resulting structure, the RC delay may be equal to or smaller than the RC delay of conventional structures that adopt low-k dielectric materials, but no air spacers.

Figure 10:
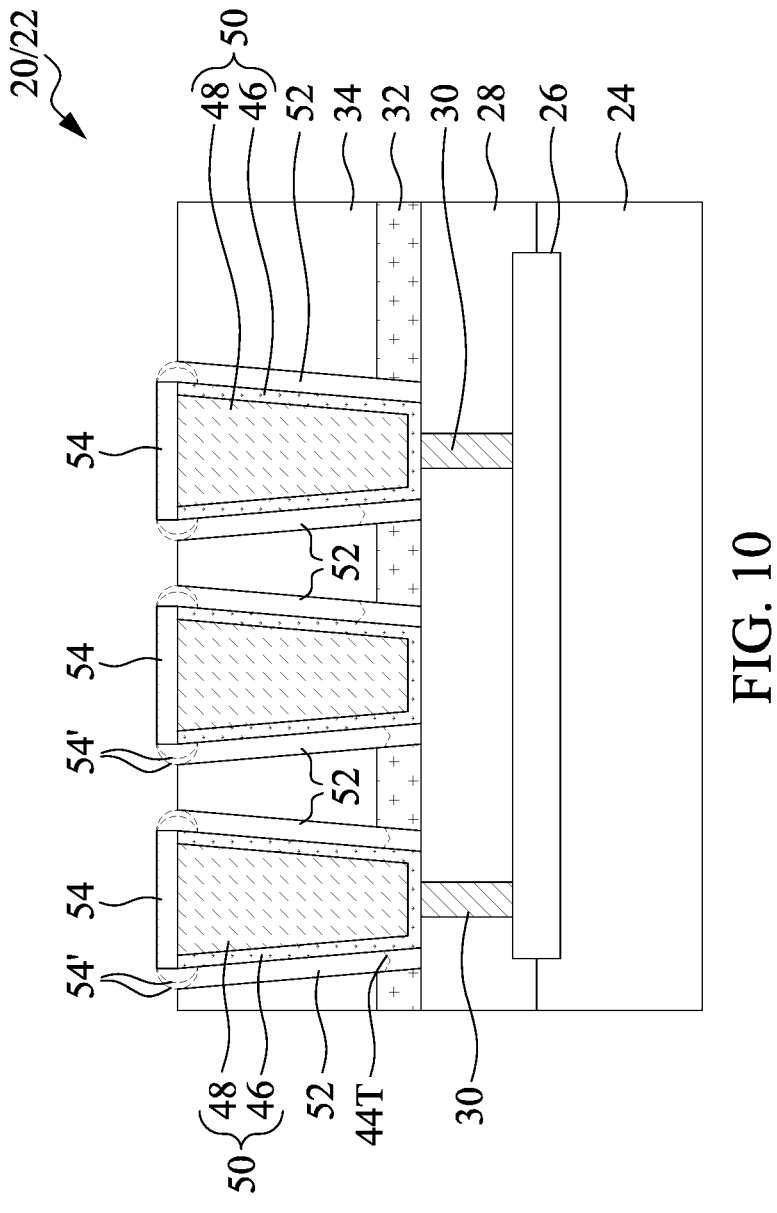

FIG. 10 illustrates the formation of metal caps 54. The respective process is illustrated as process 226 in the process flow 200 as shown in FIG. 28. In accordance with some embodiments, metal caps 54 are formed through a selective depositing process, so that metal caps 54 are selectively deposited on the exposed surfaces of conductive features 50, and not on the exposed surfaces of dielectric materials such as sacrificial spacer layer 44 and dielectric layer 34. In accordance with some embodiments, the selective deposition process may be performed through ALD or CVD. In accordance with some embodiments, metal caps 54 are formed of or comprise cobalt (Co), tungsten (W), CoWP, CoB, tantalum (Ta), nickel (Ni), molybdenum (Mo), titanium (Ti), iron (Fe), or combinations thereof. When metal caps 54 are deposited, the precursor may include a metal halide (such as $WCl_5$) or a metal organic material and a reducing agent such as $H_2$. The deposition process may be a thermal process performed at an elevated temperature, such as in the range between about 275° C. and about 500° C. The deposition may also be performed with plasma turned on.

In accordance with some embodiments, metal caps 54 are limited in the regions directly over conductive features 50. Metal caps 54 may (or may not) include extension portions extending sideways slightly to form overhangs, especially when air spacers 52 are wide. The extension portions contact the top portions of the sidewalls of conductive features 50, which sidewalls face air spacers 52. For example, FIG. 10 schematically illustrates dashed lines 54', which represent the extension portions of metal caps 54. The extension portions 54' of metal caps 54 may extend into the top portions of air spacers 52 and extend below the top surface of dielectric layer 34, especially when air spacers 52 are wide. Furthermore, extension portions 54' may be spaced part from dielectric layer 34, or may extend far enough to contact the nearest portion of dielectric layer 34. Accordingly, metal caps 54 may leave air spacers 52 opened, or may partially or fully seal air spacers 52.

Figure 9B:
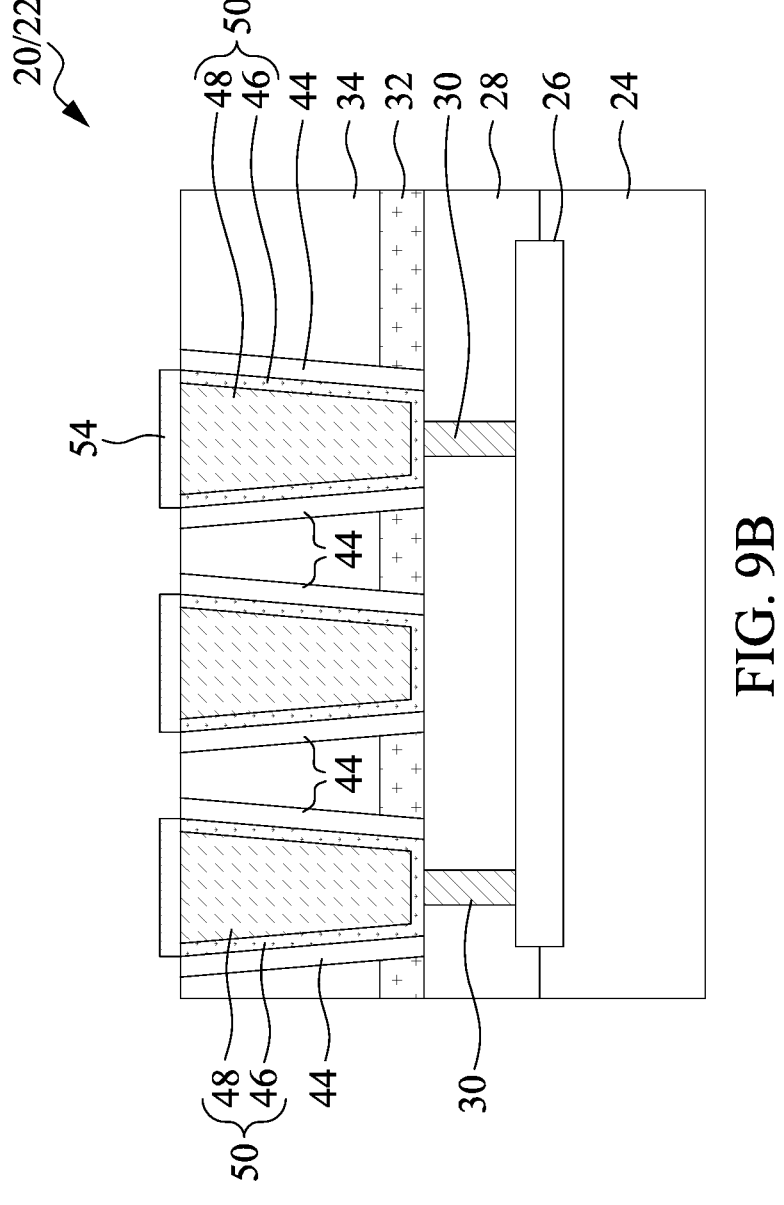

FIGS. 9A and 10 in combination disclose an embodiment in which air spacers 52 are formed first, followed by the formation of metal caps 54. In accordance with alternative embodiments, metal caps 54 are formed first, followed by the removal of sacrificial spacer layer 44 to form air spacers 52. This embodiment is shown in FIGS. 9B and 10 in combination. Referring to FIG. 9B, metal caps 54 are deposited. The deposition process is controlled, for example, by controlling the thickness of metal caps 54, so that the lateral extensions of metal caps 54 do not extend on the top of sacrificial spacer layer 44 excessively. After the formation of metal caps 54, there are enough parts of the top surface of sacrificial spacer layer 44 remaining exposed. After the formation of metal caps 54, sacrificial spacer layer 44 is removed. The resulting structure is also shown in FIG. 10. In accordance with these embodiments, however, the entirety of metal caps 54 is higher than the top surface of dielectric layer 34, and metal caps 54 do not extend into air spacers 52.

Air spacers 52 have k values equal to 1.0, which is smaller than other dielectric materials, even low-k dielectric materials. With the formation of air spacers, the parasitic capacitance between neighboring conductive features 50 is reduced.

Figure 11:
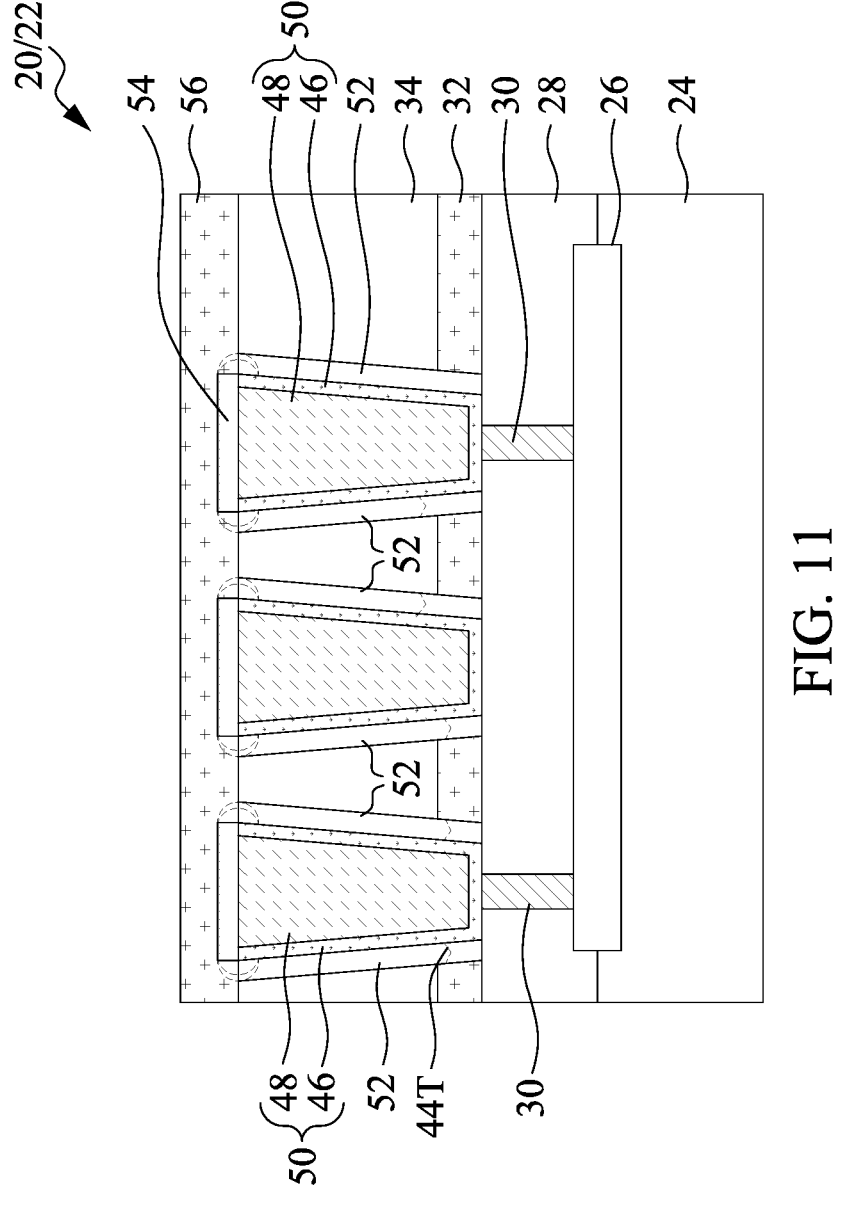

FIG. 11 illustrates the formation of etch stop layer 56. The respective process is illustrated as process 228 in the process flow 200 as shown in FIG. 28. Etch stop layer 56 contacts metal caps 54, and seals air spacer 52 (if not sealed already). In accordance with some embodiments, etch stop layer 56 may be formed of a material selected from SiN, SiC, SiON, SiOC, SiCN, or combinations thereof. Etch stop layer 56 may also include a metal oxide, a metal nitride, or the like. Etch stop layer 56 may be a single layer formed of a homogeneous material, or a composite layer including a plurality of dielectric sub-layers. In accordance with some embodiments of the present disclosure, etch stop layer 56 includes an AlN layer, a SiOC layer over the AlN layer, and an AlO layer over the SiOC layer.

Figure 12:
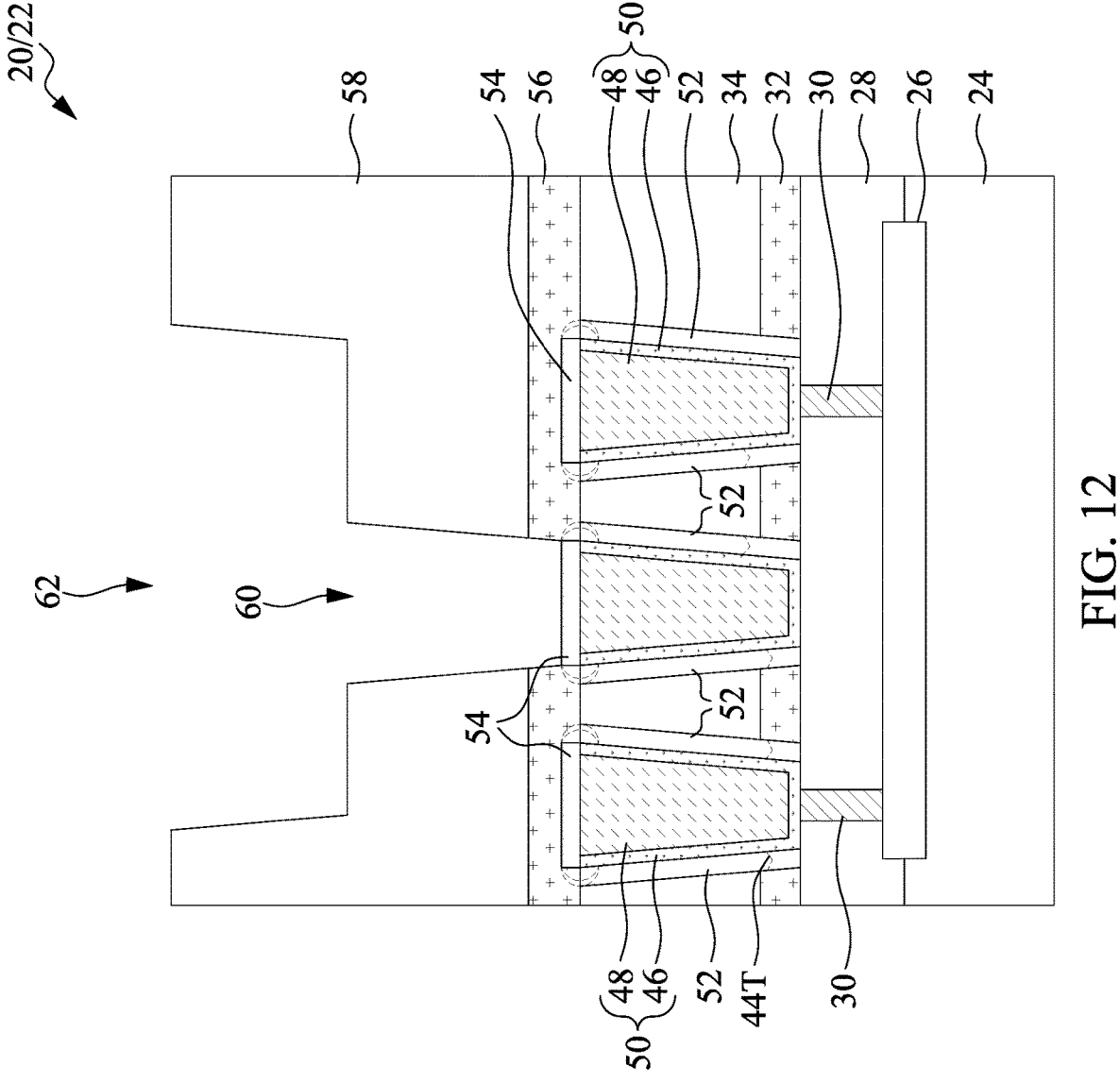
Figure 13:
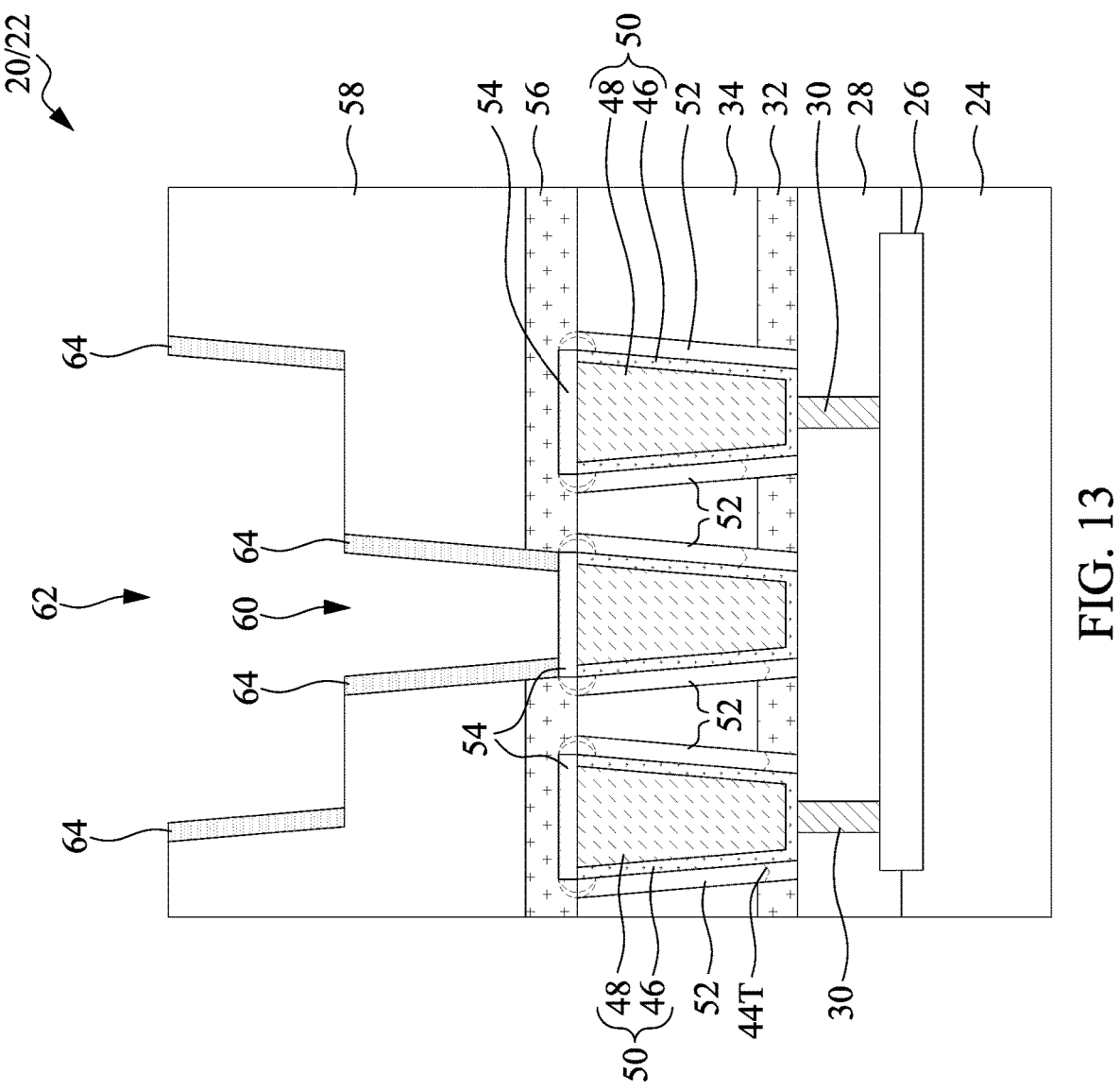
Figure 14:
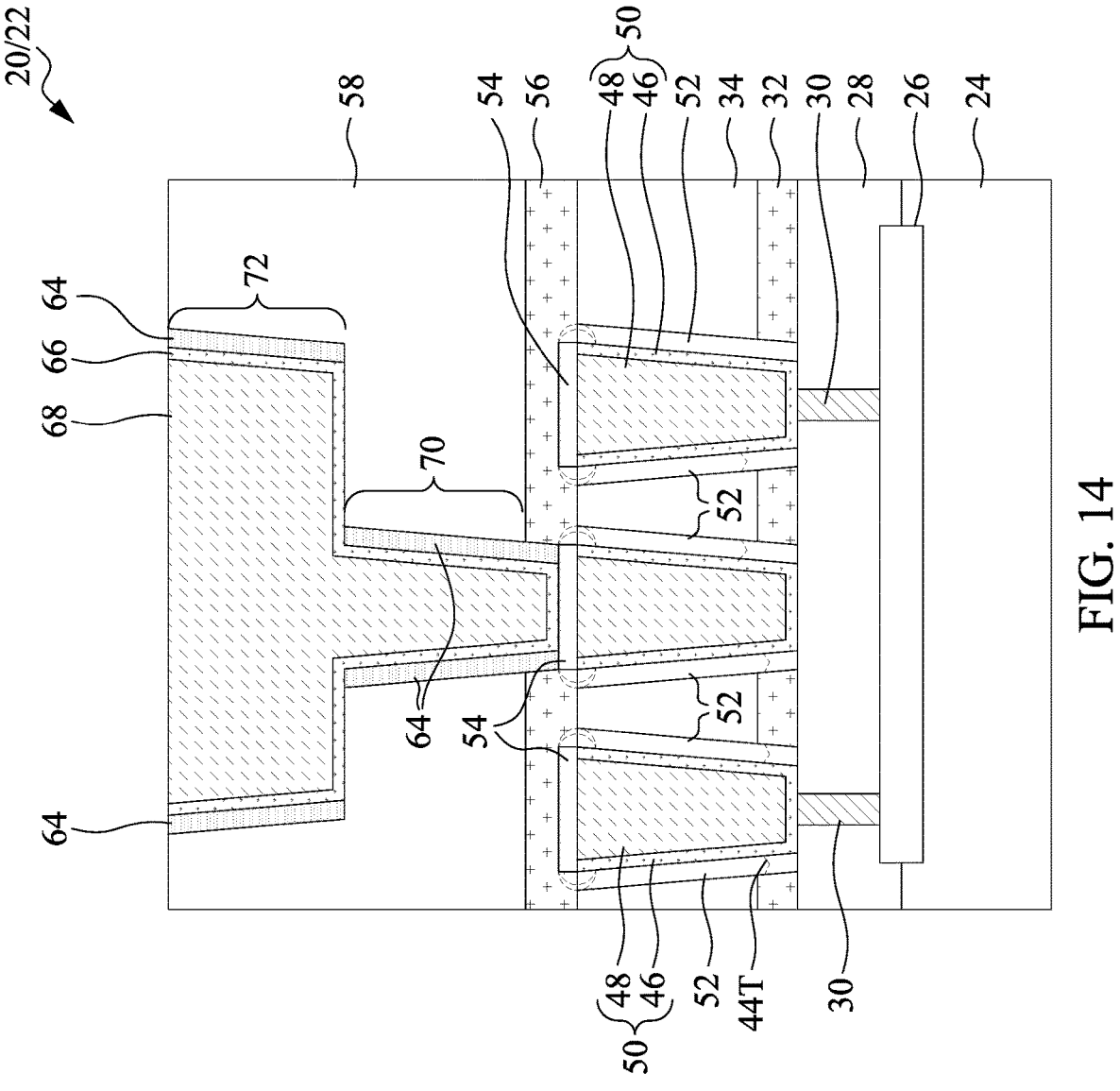

FIGS. 12 through 14 illustrate the formation of a dual damascene structure in accordance with some embodiments. Referring to FIG. 12, dielectric layer 58 is deposited. The respective process is also illustrated as process 228 in the process flow 200 as shown in FIG. 28. Dielectric layer 58 may be formed of a material selected from the same group of candidate materials for forming dielectric layer 34, and the structures and materials for forming dielectric layer 34 also apply to dielectric layer 58. The details are thus not repeated herein. For example, dielectric layer 58 may have an upper portion and a lower portion with different nitrogen atomic percentage values.

Trench 62 and via opening 60 are formed in dielectric layer 58. The respective process is illustrated as process 230 in the process flow 200 as shown in FIG. 28. In accordance with some embodiments of the present disclosure, a metal hard mask (not shown) is formed and patterned to define the patterns of trench 62. A photo lithography process is performed to etching dielectric layer 58 in order to form a via opening. The via opening extends from the top surface of dielectric layer 58 to an intermediate level between the top surface and the bottom surface of dielectric layer 58. An anisotropic etching is then performed to etch dielectric layer 58 and to form trench 62 using the metal hard mask as an etching mask. At the same time trench 62 are formed, the via opening extends downwardly to metal cap 54, hence forming via opening 60. The etching for forming trench 62 may be performed using a time-mode. In accordance with alternative embodiments, via openings 60 and trenches 62 are formed in separate photo lithography processes. For example, in a first photo lithography process, via openings 60 are formed extending down to metal cap 54. In a second lithography process, trench 62 is formed. Metal cap 54 is then exposed to via opening 60.

Referring to FIG. 13, a patterned sacrificial spacer layer 64 is formed. The respective process is illustrated as process 232 in the process flow 200 as shown in FIG. 28. The formation process of sacrificial spacer layer 64 includes depositing a conformal layer, and then performing an aniso-tropic etching process to remove horizontal portions of the conformal layer. The materials and the process details are similar to what have been discussed referring to FIGS. 4 and 5, and are not repeated herein. Sacrificial spacer layer 64 includes first vertical portions in trench 62 to form a first ring, and second vertical portions in via opening 60 to form a second ring. The first ring is larger than the second ring, and is disconnected from the second ring.

Next, referring to FIG. 14, diffusion barrier 66 and metallic material 68 are deposited. The materials and the formation processes are similar to what have been discussed referring to FIGS. 6 through 8, and the details are not repeated herein. After the deposition of diffusion barrier 66 and metallic material 68, a planarization process is per-formed, forming via 70 and metal line 72. The respective process is illustrated as process 234 in the process flow 200 as shown in FIG. 28. Each of via 70 and metal line 72 is encircled by a spacer ring formed of a part of sacrificial spacer layer 64.

Figure 15A:
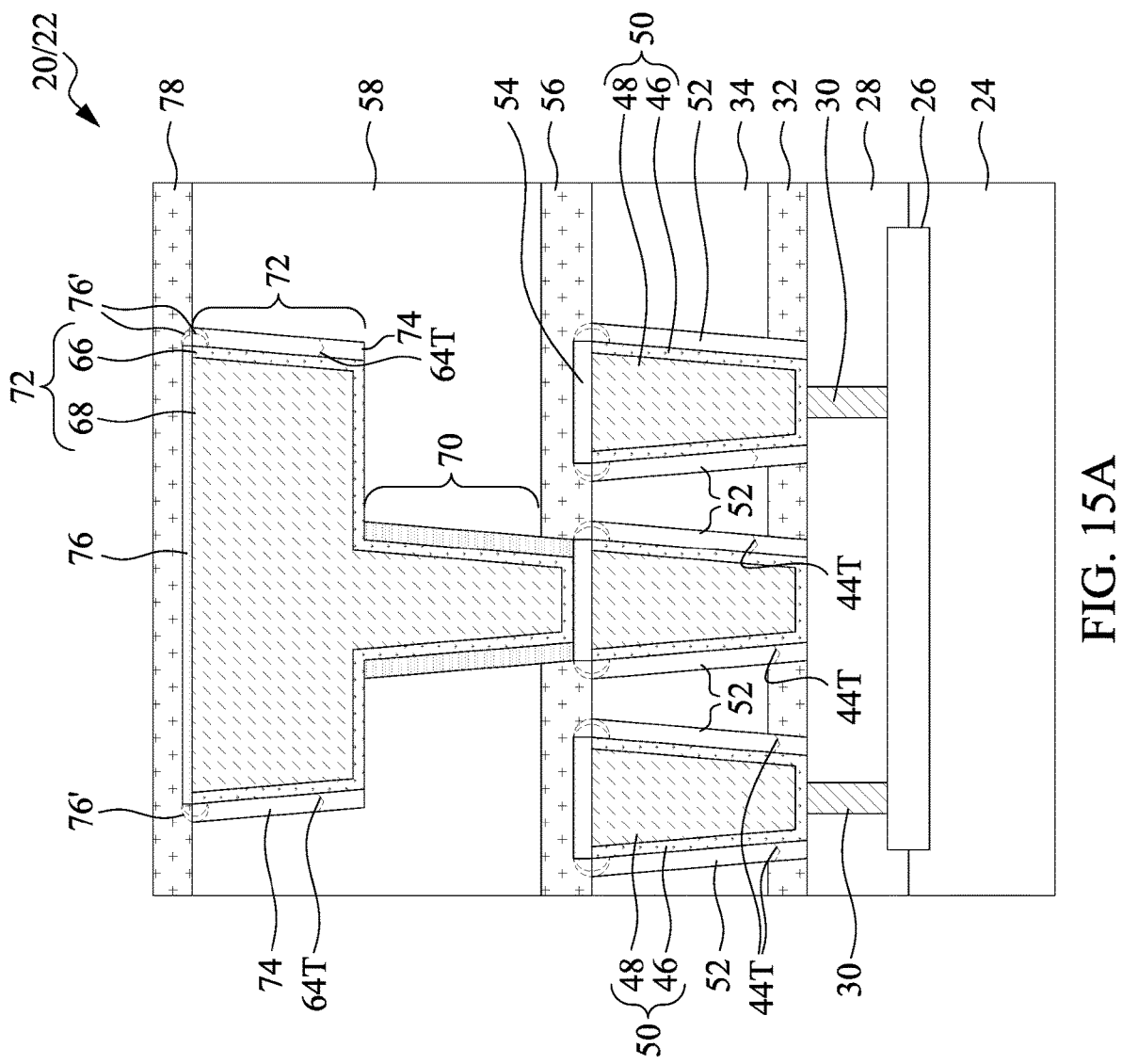

FIG. 15A illustrates the removal of sacrificial spacer layer 64 from the sidewall of metal line 72, forming air spacers 74, which form a ring when viewed from top of wafer 20. The respective process is illustrated as process 236 in the process flow 200 as shown in FIG. 28. The removal may also be performed through an isotropic etching process. The result-ing air spacers 74 may extend to, and may be exposed to, the top surface of the underlying portion of dielectric layer 58. There may be, and may not be, residue sacrificial spacer layer 64 left, wherein the top surfaces of the example residue sacrificial spacer layer 64 are shown as 64T. Furthermore, due to process variation and loading effect, the residue sacrificial spacer layer 64 may have similar situations as residue sacrificial spacer layer 44 as discussed preceding paragraphs. For example, some parts of sacrificial spacer layer 44 may have more residues left than other parts, and some parts of sacrificial spacer layer 44 may not have residue left. The possible scenarios may be found referring to the discussion of air spacers 52.

Since the part of sacrificial spacer layer 64 encircling via 70 cannot be removed, these parts of sacrificial spacer layer 64 will be left in the final structure. It is appreciated that these parts of sacrificial spacer layer 64 will result in increased parasitic capacitance compared to air spacers and low-k dielectric material. Vias 70, however, are laterally short, and are most likely to have longer distance from neighboring vias. Accordingly, the adverse increase in the parasitic capacitance is small compared to the reduction in parasitic capacitance due to the formation of air spacers 74. Alternatively stated, the reduction in the parasitic capaci-tance more than offsets the increase in the parasitic capaci-tance.

FIG. 15A further illustrates the formation of metal cap 76, which may be formed of a material and a method selected from the same group of candidate materials and candidate methods, respectively, for forming metal caps 54. Metal cap 76 may be formed before or after the formation of air spacers 74, which is similar to the embodiments as shown in FIGS. 9A and 9B. Also, when metal cap 76 is formed after the formation of air spacers 74, extension portions 76' may be formed and extend below the top surface of dielectric layer 58. Alternatively, when metal cap 76 is formed before the formation of air spacers 74, an entirety of metal cap 76, including the extension portions 76' that is directly over air spacers 74, will not extend below the top surface of dielec-tric layer 58. Etch stop layer 78 may then be deposited.

Figure 15B:
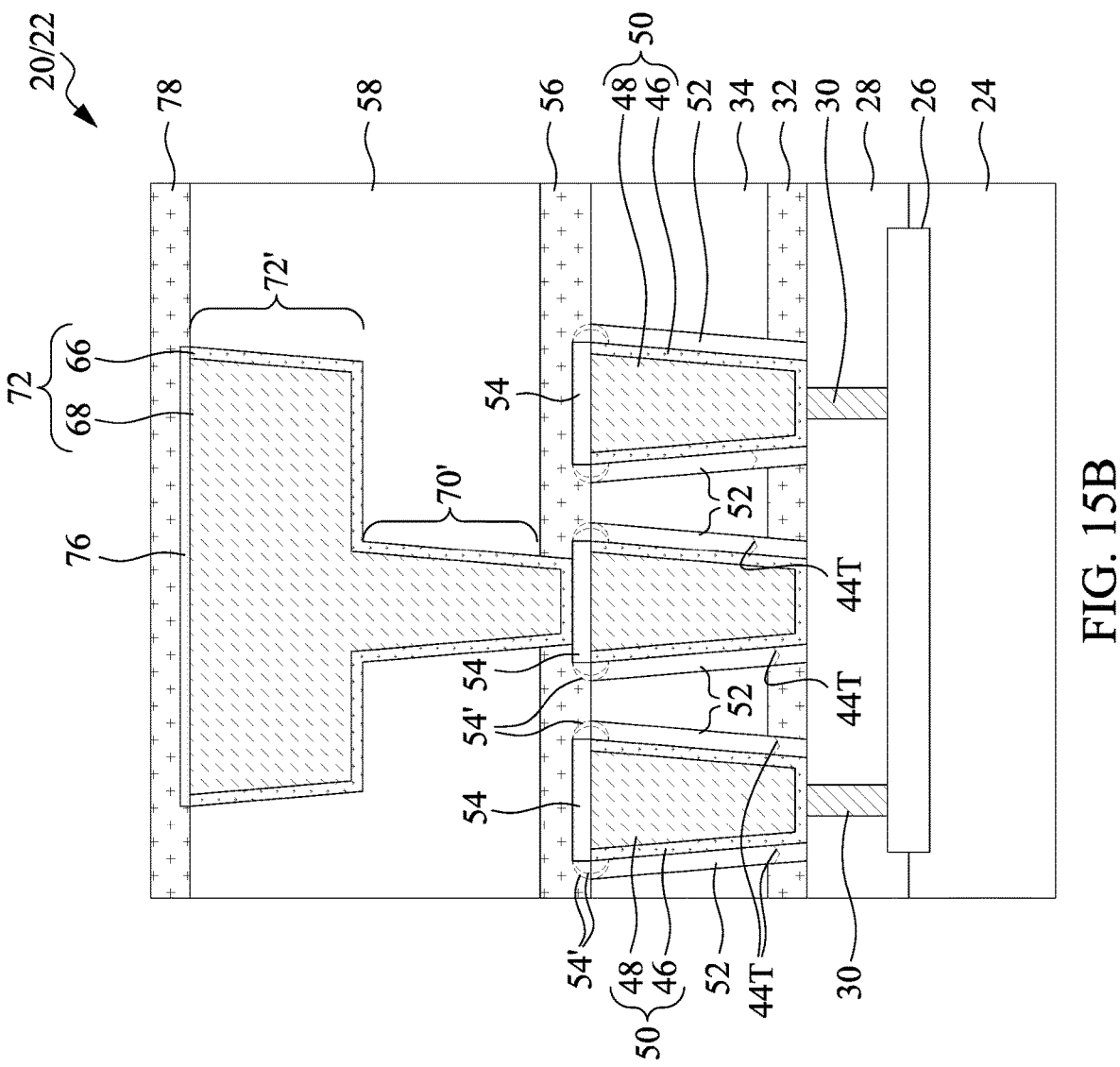
FIG. 15B illustrates the cross-sectional view of a dual damascene structure without being surrounded by any air spacer in accordance with some embodiments.

FIG. 15B illustrates the formation of air-gap-free via 70' and metal line 72' in accordance with alternative embodi-ments. These embodiments are similar to the embodiments as shown in FIG. 15A, except that no sacrificial spacer layer is formed, and accordingly, no air spacers are formed. Accordingly, dielectric layer 58 may have a lower k-value since it does not have the concern of dielectric tilting and collapsing. For example, dielectric layer 58 may have a k value lower than about 3.5 or lower than about 3.0, for example, between about 2.5 and about 3.0. Dielectric layer 58 may also have pores therein, which may be achieved by incorporating porogen in the deposition of dielectric layer 58, and removing the porogen through annealing.

In the embodiments shown in FIG. 15B, via 70' and metal line 72' are in physical contact with the sidewalls of the surrounding dielectric layer 58. It is appreciated that although FIG. 15B illustrates that air-gap-free via 70' and metal line 72' are formed immediately over conductive features, in accordance with alternative embodiments, the air spacer 74 as shown in FIG. 15A may be formed in a dielectric layer immediately over dielectric layer 34, while the air-gap-free via 70' and metal line 72' are formed in layers over the layer in which air spacer 74 is formed since parasitic capacitance problem is less severe in upper metal layers than in lower metal layers.

Figure 15C:
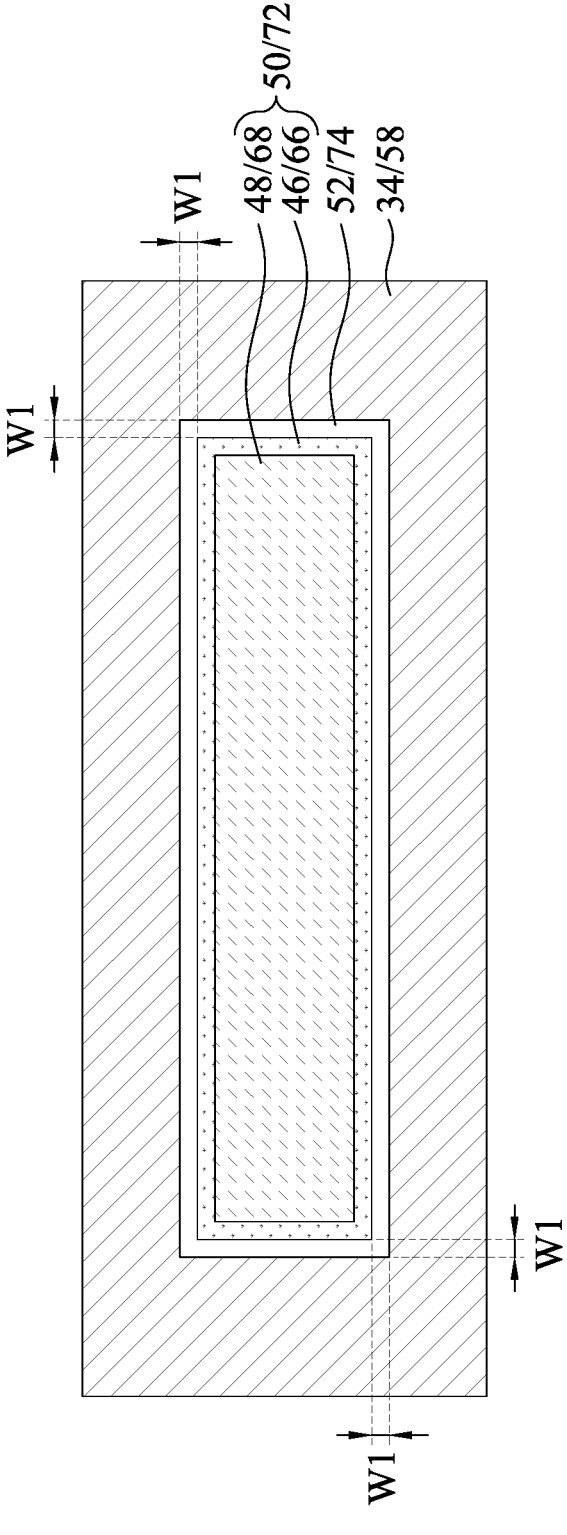
FIG. 15C illustrates a top view of an air spacer in accordance with some embodiments.

FIG. 15C illustrates a top view of air spacer 52 or 74 in accordance with some embodiments. As shown in FIG. 15C, each of air spacers 52 and 74 may form a full ring encircling the corresponding conductive feature 50/72. Each of air spacers 52 may have a substantially uniform width W1 (for example, with variation being smaller than about 10 per-cent). The width W1 may be measured at the middle height of the corresponding air spacers 52 and 74. The width W1 of air spacer 52 may be the same as or different from the width W1 of air spacer 74. Furthermore, when viewed from a cross-sectional view, air spacer 52 has a substantially uniform width (for example, with variation smaller than about 20 percent or smaller than about 10 percent) from top to bottom, and air spacer 74 has a substantially uniform width (for example, with variation smaller than about 20 percent or smaller than about 10 percent) from top to bottom.

Figure 17:
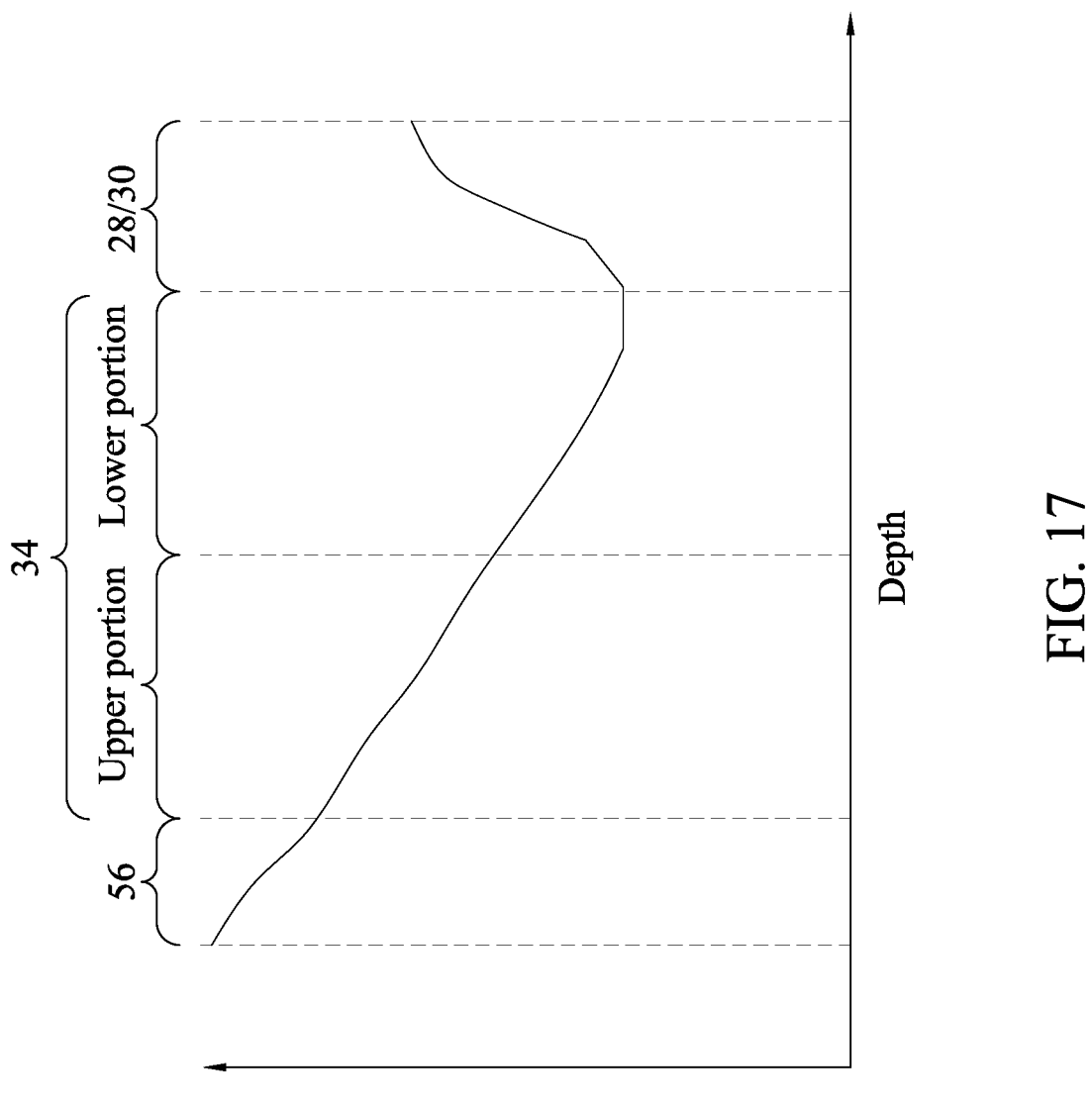
FIGS. 17 and 18 illustrate some example profiles of nitrogen atomic percentage values in accordance with some embodiments.
Figure 18:
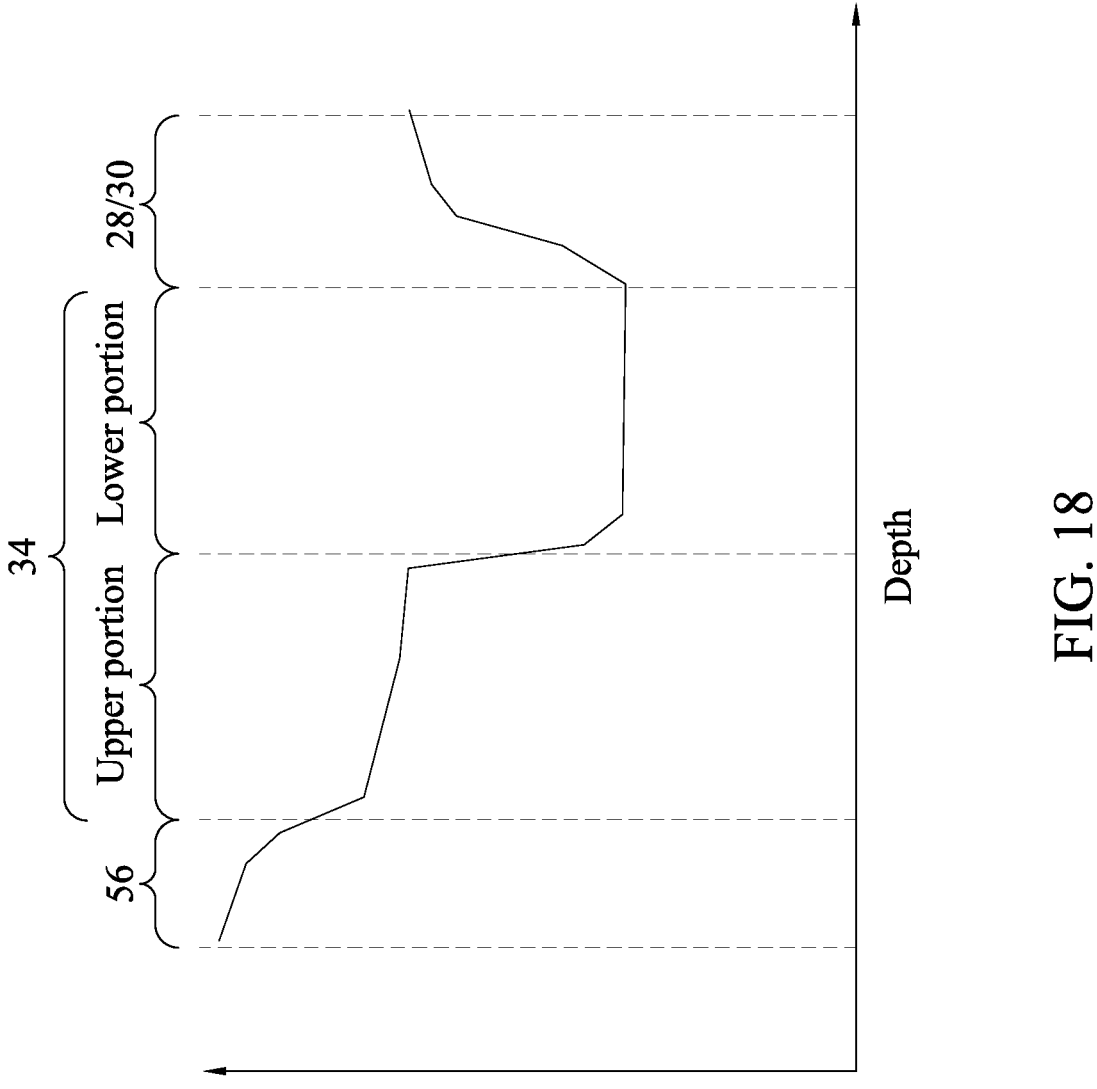

FIGS. 17 and 18 illustrate some example profiles of nitrogen in dielectric layer 34 in accordance with some embodiments. It is assumed that etch stop layers 32 and 56 have high nitrogen atomic percentage values. In FIG. 17, dielectric layer 34 has increasingly greater nitrogen atomic percentage values from bottom to top. In FIG. 18, a lower portion of dielectric layer 34 has a constant nitrogen atomic percentage, while an upper portion of dielectric layer 34 has increasingly higher atomic percentage values. FIGS. 17 and 18 may also reflect the schematic flow rates of the nitrogen-comprising precursor used for depositing dielectric layer 34.

FIGS. 19 through 22 illustrate the cross-sectional views of intermediate stages in the formation of an interconnect structure in accordance with some embodiments of the present disclosure. Unless specified otherwise, the materials and the formation processes of the components in these embodiments are essentially the same as the like compo-nents, which are denoted by like reference numerals in the preceding embodiments shown in FIGS. 1-14, 15A, 15B, and 15C. The details regarding the formation process and the materials of the components shown in FIGS. 19 through 22 may thus be found in the discussion of the preceding embodiments. The initial steps of these embodiments are essentially the same as shown in preceding embodiments.

Figure 19:
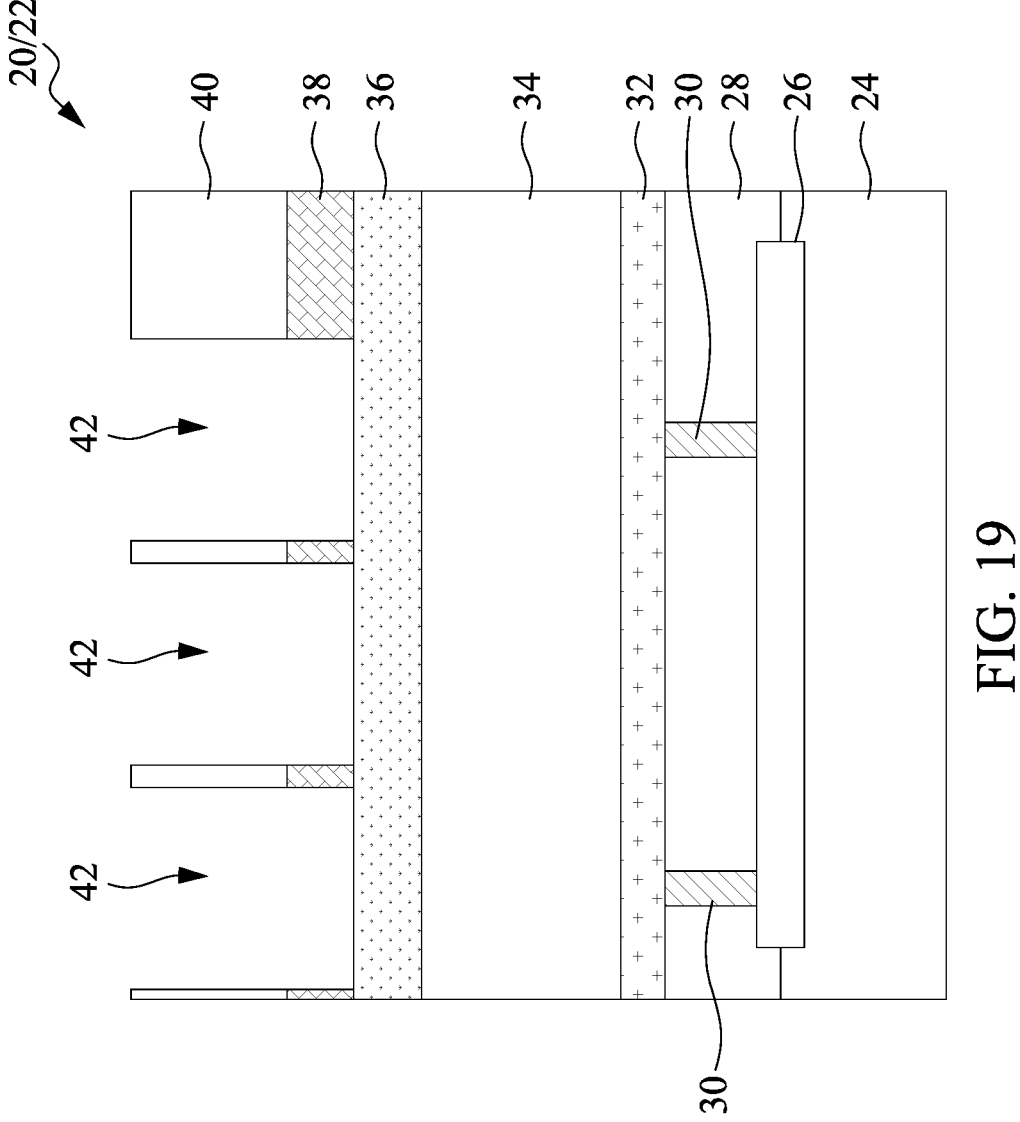
FIGS. 19-22 illustrate the cross-sectional views of intermediate stages in the formation of an interconnect structure in accordance with some embodiments.
Figure 29:
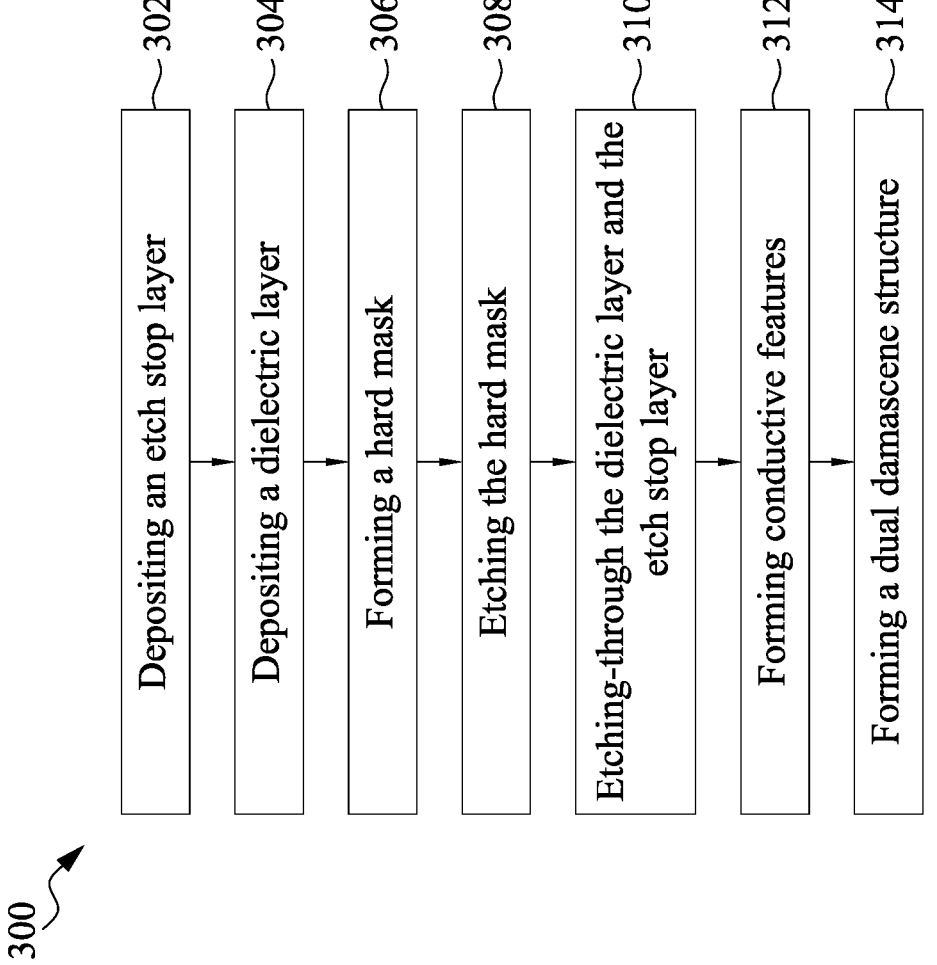
FIG. 29 illustrates a process flow for forming conductive features in accordance with some embodiments.

FIG. 19 illustrates the formation of an initial structure. This structure is essentially the same as the structure shown in FIG. 2, except that dielectric layer 34 is formed differently than in the preceding embodiments, and no air spacer is formed. First, etch stop layer 32 is deposited. The respective process is illustrated as process 302 in the process flow 300 as shown in FIG. 29. Dielectric layer 34 is then deposited. The respective process is illustrated as process 304 in the process flow 300 as shown in FIG. 29. In accordance with some embodiments, dielectric layer 34 is formed to have a high concentration of Si—C—Si bonds. As will be discussed in subsequent paragraphs, forming dielectric layer 34 with a high concentration of Si—C—Si bonds may reduce the carbon-depletion problem, which may incur TDDB performance degradation and the increase in RC delay. The dielectric constant (k value) of dielectric layer 34 may be lower than about 3.5, and may be in the range between about 3.0 and about 3.5. Accordingly, dielectric layer 34 may be a low-k dielectric layer.

Figure 23:
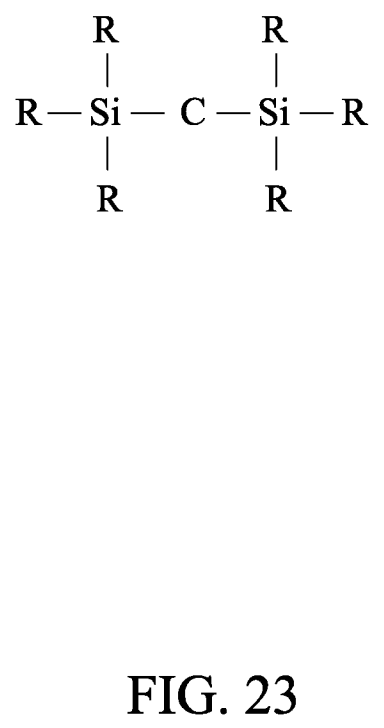

In accordance with some embodiments, the formation of dielectric layer 34 may be performed using PECVD, SACVD, ALD, or the like. The precursors may include a first precursor that includes Si—C—Si bonds, and a second precursor that provides carbon. FIG. 23 illustrates an example precursor comprising Si—C—Si bonds, while other precursors comprising Si—C—Si bonds may also be used. The functional group "R" in FIG. 23 and the subsequently discussed FIG. 24 may include $CH_3$, $C_2H_5$, or the like. The second precursor, may include a carbon-containing precursor such as $CO_2$, CO, or the like, and may or may not include oxygen ($O_2$). By adopting the precursor comprising Si—C—Si bonds, the resulting dielectric layer 34 has a higher concentration of Si—C—Si bonds, which may be determined using Fourier-Transform Infrared Spectroscopy (FTIR), with the peak of the Si—C—Si bonds being in the range between about 1,342/cm and about 1381/cm. Otherwise, although Si—C—Si bonds may also be generated from the precursors that do not include Si—C—Si bonds directly, the concentration of Si—C—Si bonds in dielectric layer 34 will be low. Si—C—Si bonds may improve the resistance of dielectric layer 34 to carbon depletion, and may improve the TDDB performance and reduce RC delay.

Figure 24:
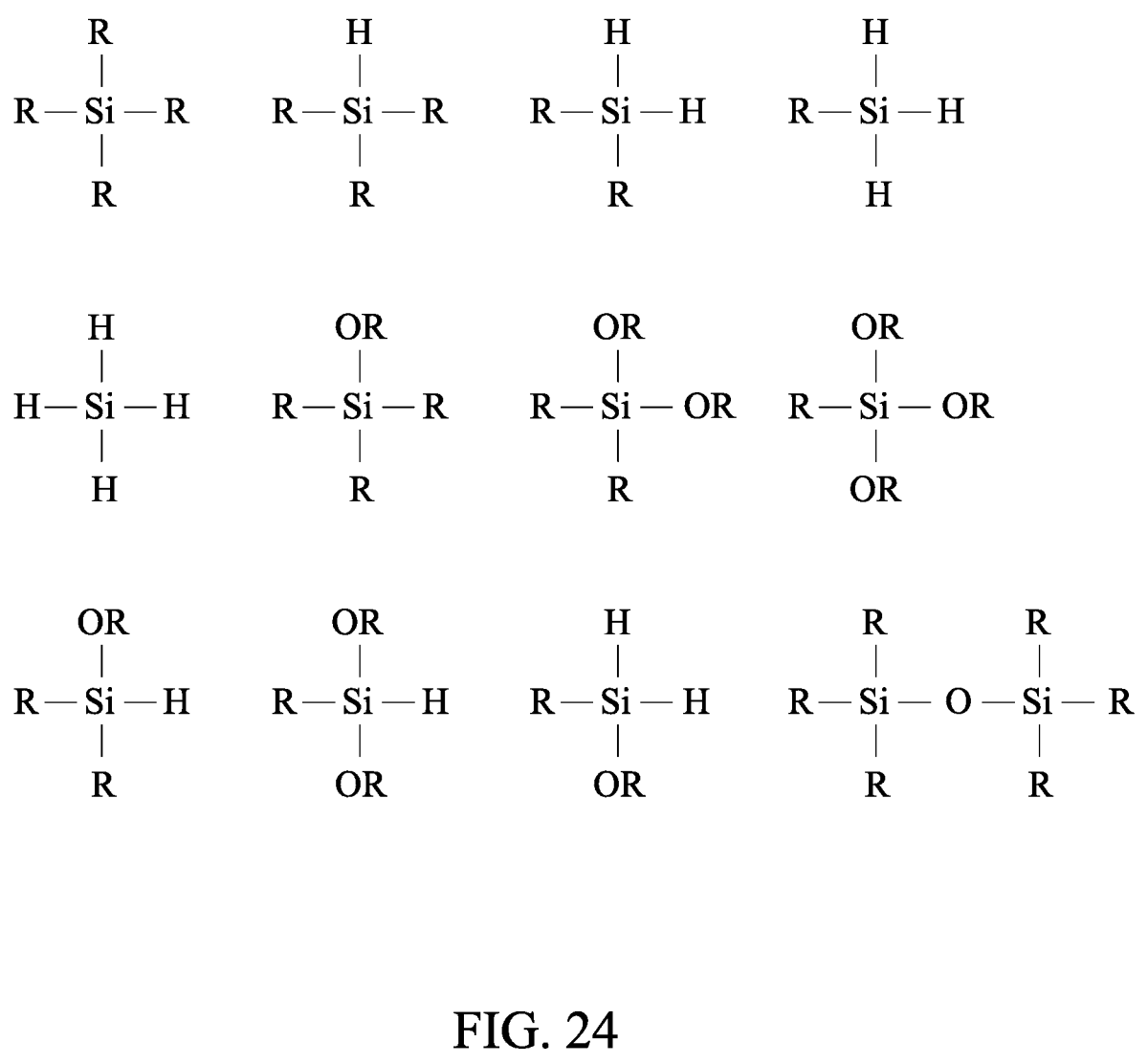

The precursors for forming dielectric layer may, or may not, include a third precursor, which do not include Si—C—Si bonds. FIG. 24 illustrates some examples of the third precursor. The third precursor may include silicon and carbon atoms, and possibly hydrogen atoms. The silicon and carbon atoms may also form functional groups such as $CH_3$, $C_2H_5$, or the like.

In accordance with some embodiments, the deposition process of dielectric layer 34 includes PECVD, wherein the flow rate of the precursors may be in the range between about 30 sccm and about 1,500 sccm, and/or in the range between about 200 mgm and about 2,000 mgm. The temperature of wafer 20 during the deposition process cannot be too high or too low. If the temperature is too high, the deposition rate will be reduced and the deposition time is increased, resulting in too-high thermal budget. If the temperature is too low, there will be too much OH bonds formed, resulting in a high k value, which leads to high RC delay. Accordingly, the deposition temperature may be in the range between about 200° C. and about 420° C. In the resulting dielectric layer 34, carbon atomic percentage may be in the range between about 10 percent and about 30 percent. The deposition time may be in the range between about 30 seconds and about 100 seconds. The resulting dielectric layer 34 may include SiOCH, SiOC, or the like.

In accordance with some embodiments, in the deposition of dielectric layer 34, porogen may be (or may not be) added, and accordingly, dielectric layer 34 may or may not include pores. Since the carbon-depletion problem is more severe in upper portions of dielectric layer 34 (as revealed by FIGS. 26 and 27), to minimize the carbon-depletion problem, the upper portions (such as the upper half or upper ¾) of dielectric layer 34 may be different from the lower portions, for example, with the upper portions having greater concentrations of Si—C—Si bonds than the respective lower portions (such as the lower half or lower ¼). This may be achieved by increasing the flow rate of the Si—C—Si-comprising precursor when depositing the upper portions. The lower portion may be formed using a precursor selected from FIG. 24 without using any Si—C—Si-comprising precursor. Alternatively, the lower portion may be formed using a first precursor selected from FIG. 24 and a second precursor comprising Si—C—Si bonds, with the second precursor having a low flow rate than for forming the upper portions. When the upper portions are formed, the Si—C—Si-comprising precursor may be added, and/or the flow rate may be increased.

Furthermore, in accordance with some embodiments, starting at a certain point of the deposition of dielectric layer 34, the flow rate of the Si—C—Si-comprising precursor may be increased continuously or increased by stages. The certain point may be the beginning of the deposition of dielectric layer 34, or may be an intermediate point (such as after ¼ or a half of dielectric layer 34 has been deposited). Before the certain point, there may be (or may not be) Si—C—Si-comprising precursor, and the flow rate of the non-Si—C—Si-comprising precursor may be kept unchanged. Alternatively, to increase the concentration of Si—C—Si in the upper portions, instead of increasing the flow rate of the Si—C—Si-comprising precursor, the non-Si—C—Si-comprising precursor may be reduced.

Figure 20:
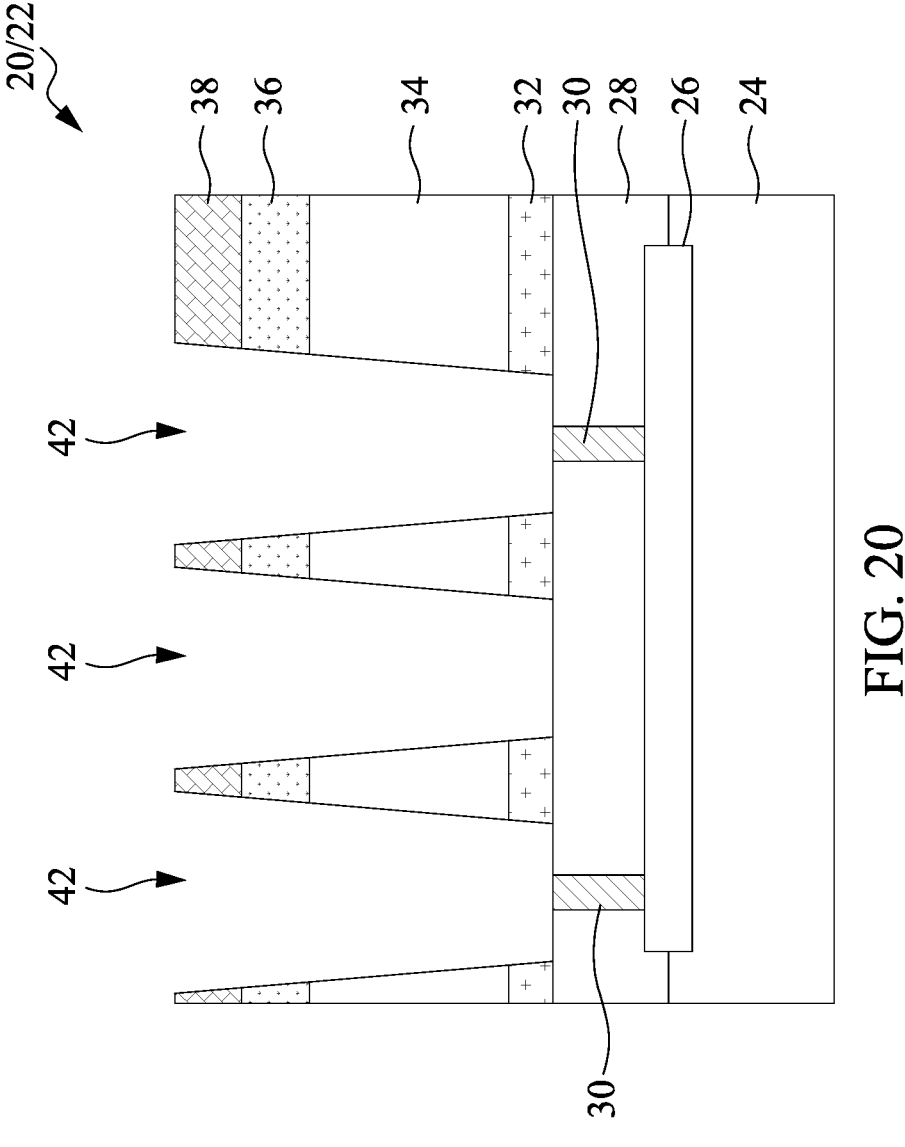
Figure 21:
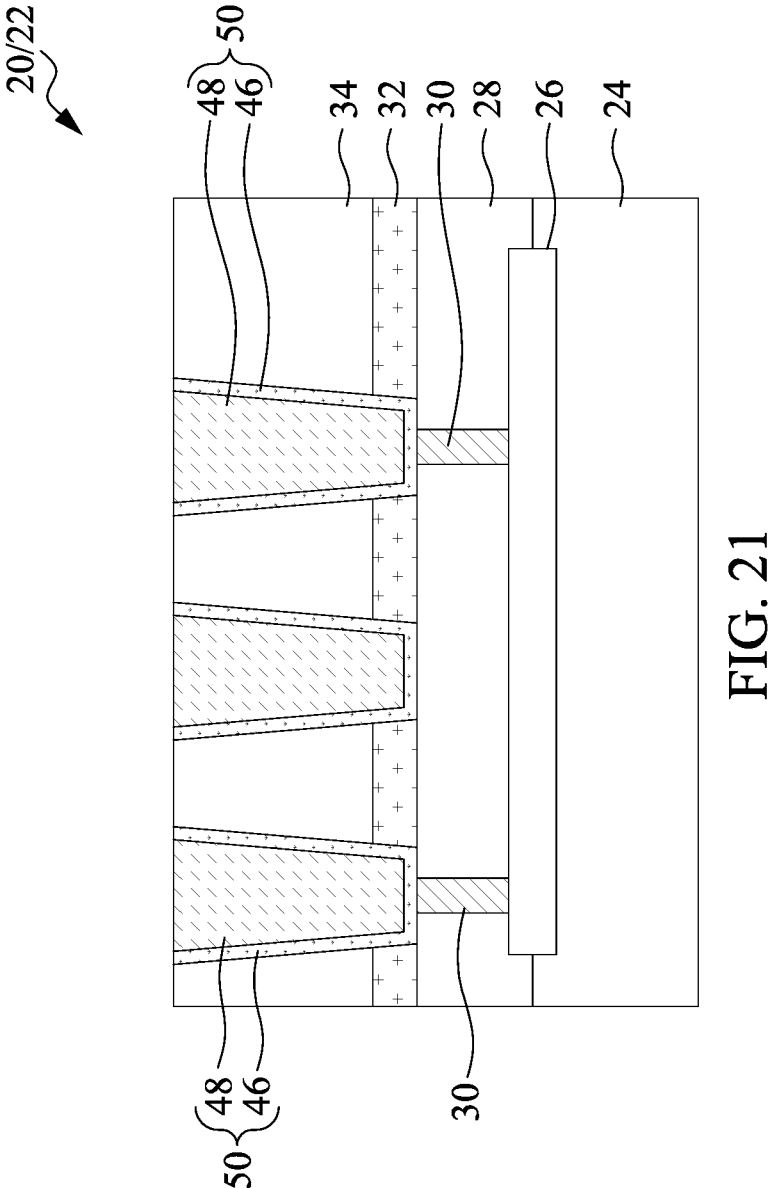

Next, as also shown in FIG. 19, pad layer 36 and hard mask 38 are formed. The respective process is illustrated as process 306 in the process flow 300 as shown in FIG. 29. Hard mask 38 is patterned to form openings 42. The respective process is illustrated as process 308 in the process flow 300 as shown in FIG. 29. In a subsequent process, as shown in FIG. 20, openings 42 are extended downwardly through etching processes until openings 42 penetrate through dielectric layer 34 and etch stop layer 32. The respective process is illustrated as process 310 in the process flow 300 as shown in FIG. 29. FIG. 21 illustrates the formation of conductive features 50. The respective process is illustrated as process 312 in the process flow 300 as shown in FIG. 29. The details of conductive feature 50 are discussed in preceding embodiments, and are not repeated herein.

Figure 22:
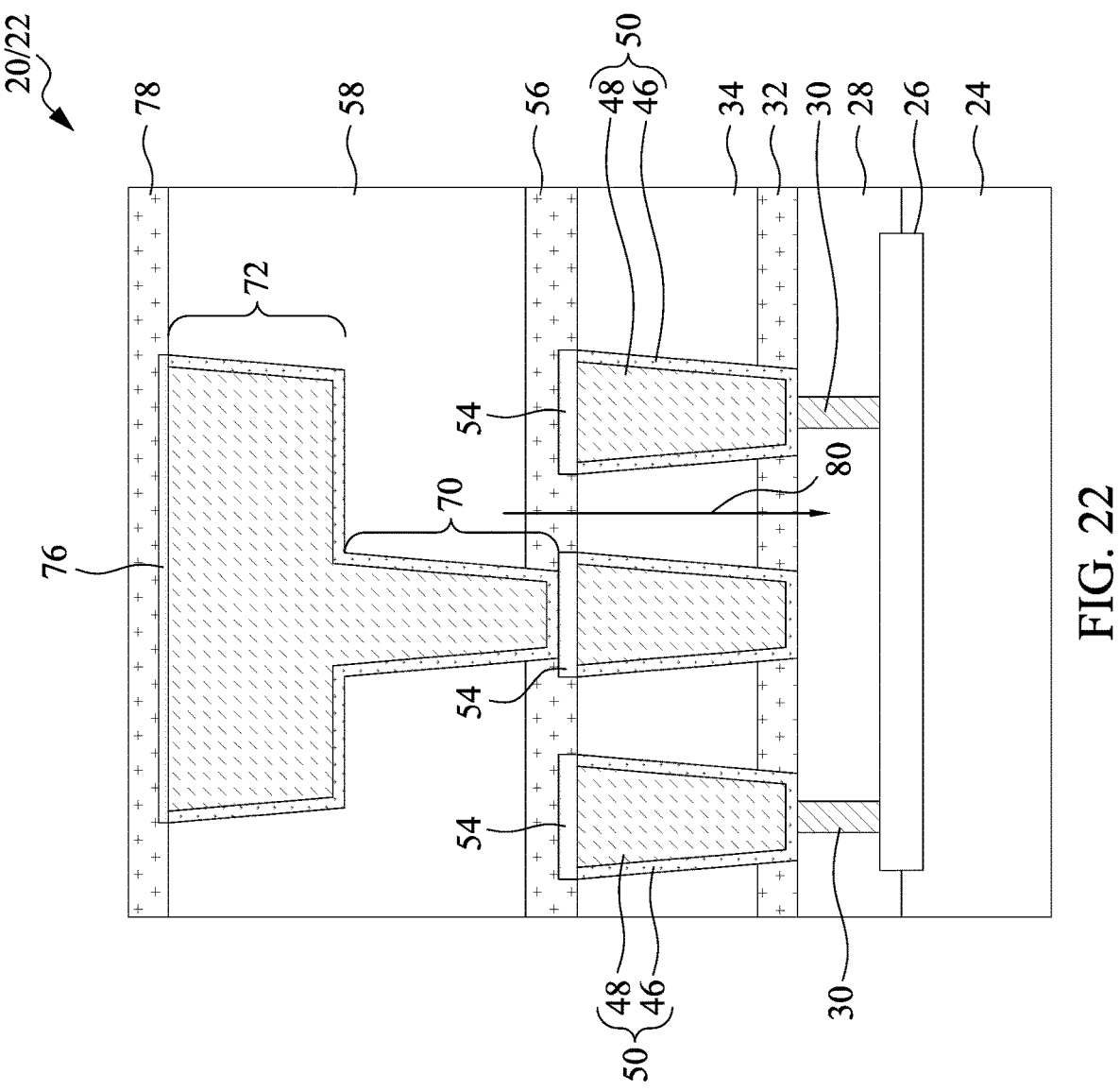

FIG. 22 illustrates the formation of metal caps 54, etch stop layer 56, dielectric layer 58, and etch stop layer 78. Via 70, metal line 72, and metal cap 76 are also formed. The respective process is illustrated as process 314 in the process flow 300 as shown in FIG. 29. The details are discussed in preceding embodiments, and are not repeated herein.

In accordance with some embodiments, the metal lines and vias in dielectric layer 58 are spaced apart farther from each other than the conductive features 50 in dielectric layer 34. Accordingly, the carbon depletion problem is less severe in dielectric layer 58 than in dielectric layer 34. Dielectric 58 may thus be formed adopting precursors that are free from the Si—C—Si bonds. For example, dielectric layer 58 may be formed using the precursors shown in FIG. 24. Alternatively, dielectric layer 58 may be formed using a lower flow rate of the Si—C—Si-comprising precursor than for forming dielectric layer 34. As a result, dielectric layer 58 has a lower Si—C—Si concentration than in dielectric layer 34.

FIG. 25 illustrates the scheme of the possible layers of conductive features in wafer 20 (die 22). Transistor 114 is formed at the top surface of semiconductor substrate 24, and transistor 114 represents the integrated circuit devices 26 as shown in FIG. 15A, 15B, or FIG. 22. Transistor 114 includes gate stacks 110 and source/drain regions 112. Over transistor 114, there is a contact (CT) layer, in which contact plugs 30 (FIGS. 15A/15B and 22) are formed. Metal layer M0, which may include metal lines therein, are formed over contact layer. There are also a plurality of metal layers such as M1 through M14 and via layers such as V1 through V13 formed. These layers may be formed using single damascene processes or dual damascene processes.

Air spacers may be formed aside the metal features in any of these layers in any combination. When air spacers are formed in the layers that are formed using single damascene processes, the processes as shown in FIGS. 4-8, 9A, 9B and 10-11 may be adopted. When air spacers are formed in the layers that are formed using dual damascene processes, the processes as shown in FIGS. 12 through 15A may be adopted. In accordance with some embodiments, the dielectric layers of lower layers such as metal layers M0, M1, M2, etc., may have higher nitrogen atomic percentage than the dielectric layers of the upper metal layers. Also, the Si—C—Si bond concentration in the dielectric layers of the lower metal layers may be greater than in the dielectric layers of the upper metal layers.

In accordance with some embodiments, there is a threshold metal layer (such as M3, M4, or M5), and the dielectric layers of the lower metal layers including and lower than the threshold metal layer have higher nitrogen atomic percentages than the dielectric layers of the upper metal layers higher than the threshold metal layer. There may not be air spacer formed in any of the upper metal layers. Also, the dielectric layers of the lower metal layer may be formed with precursors comprising Si—C—Si bonds, while the dielectric layers of the upper metal layers may be formed with precursors not comprising Si—C—Si bonds.

Figure 26:
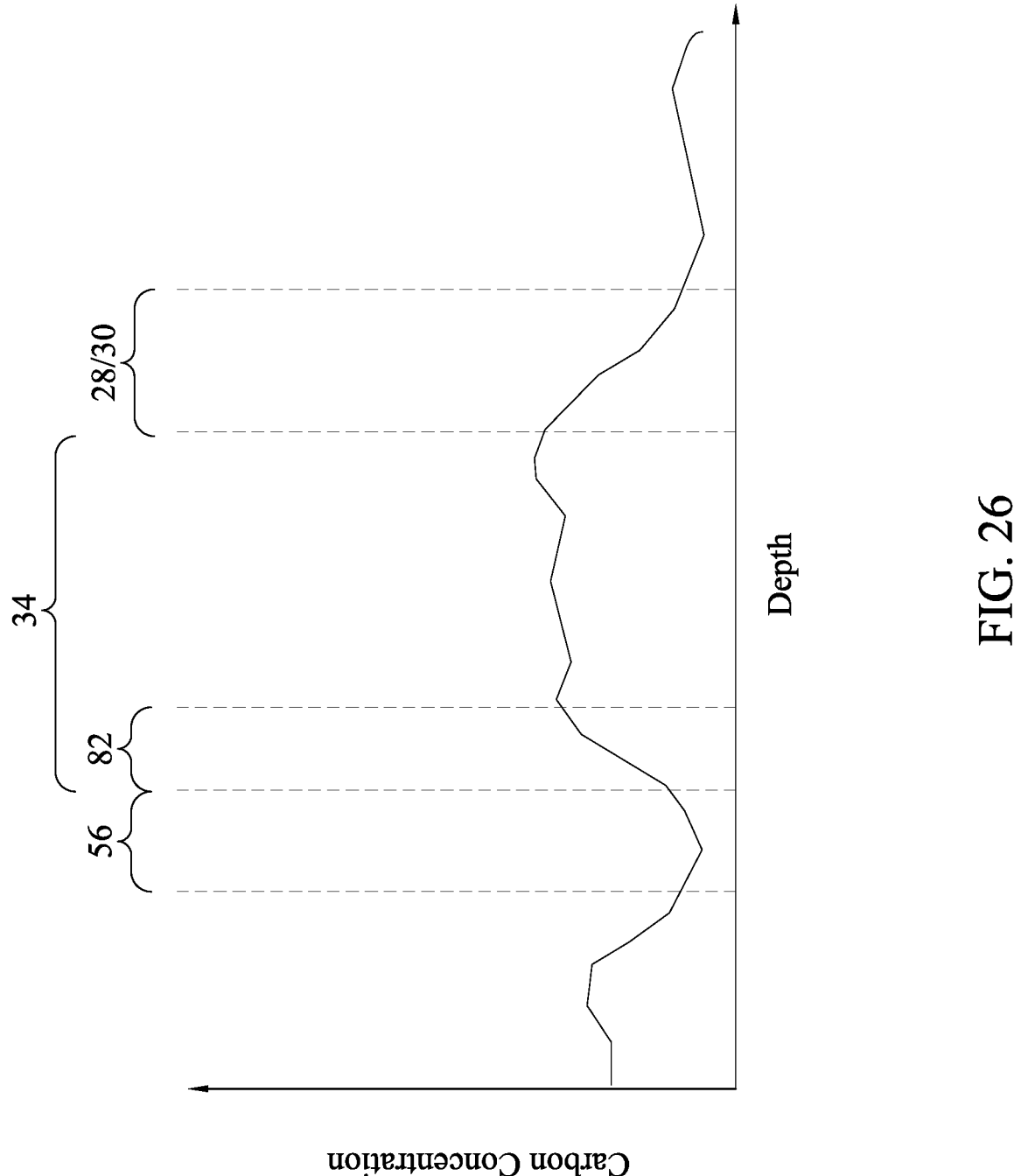
FIGS. 26 and 27 illustrate the carbon concentrations in some dielectric layers in accordance with some embodiments.
Figure 27:
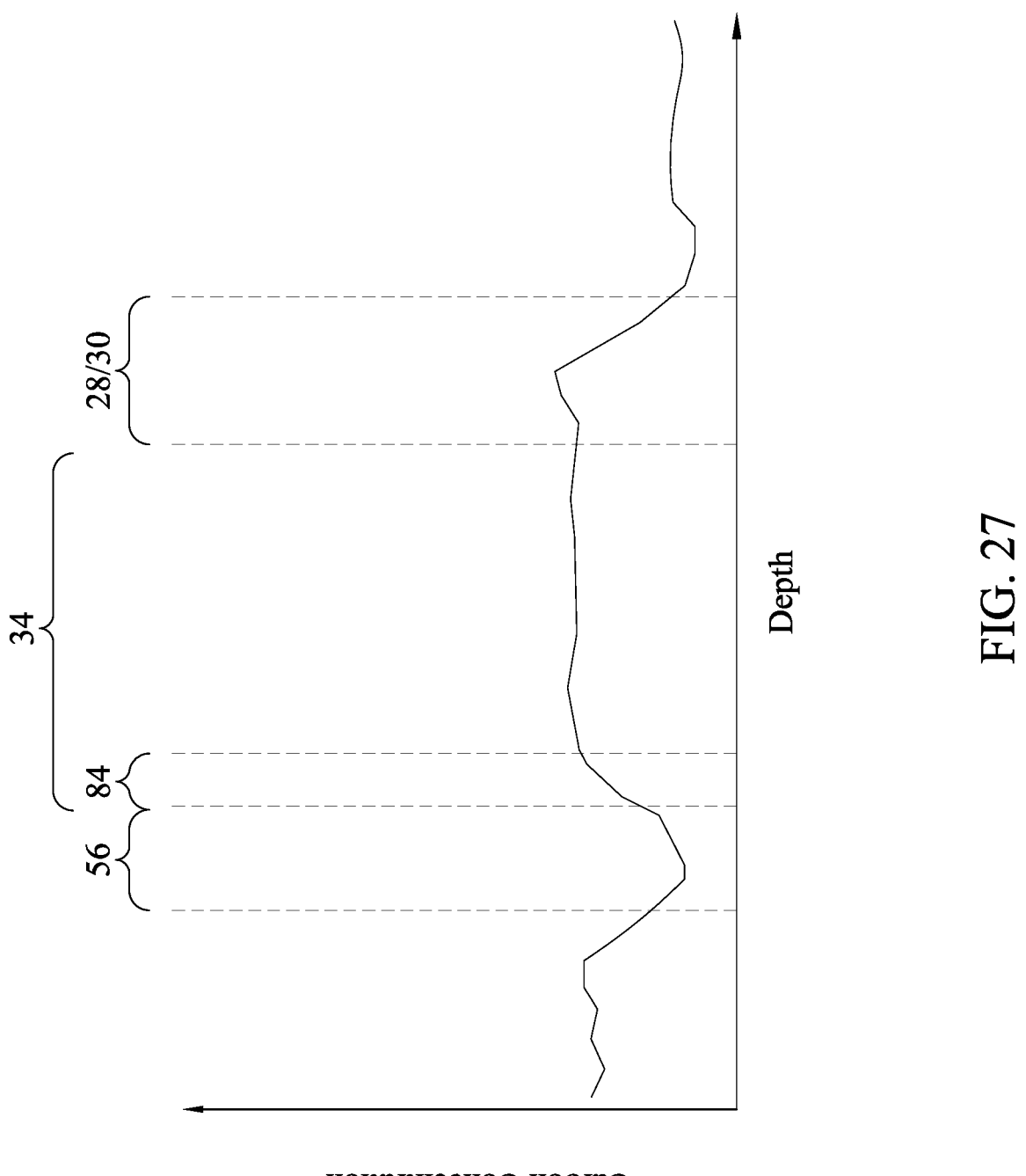

FIGS. 26 and 27 illustrate the profile of carbon atomic percentage values in accordance with some embodiments. The x-axis represents the depth measured from the top surface of dielectric layer to the bottom of etch stop layer in the position marked by arrow 80 in FIG. 22. The Y-axis represents the relative carbon atomic percentage values. FIG. 26 illustrates the carbon atomic percentage values in dielectric layer 34 in which no Si—C—Si-comprising precursors are used. FIG. 27 illustrates the carbon atomic percentage values in dielectric layer 34 in which Si—C—Si-comprising precursors are used. FIGS. 26 and 27 illustrate that the carbon depletion mainly occurs close to the top portions of dielectric layer 34 because the dielectric strips 34 are narrower than the lower portions. It is observed that in FIG. 27, the carbon-depletion region 84 is much narrower than the carbon-depletion region 82 in FIG. 26, indicating that more Si—C—Si bonds may effectively reduce carbon depletion.

The embodiments of the present disclosure have some advantageous features. From one aspect, when air spacers are formed in a dielectric layer, the dielectric layer is formed as having improved mechanical strength (by adopting more nitrogen). The tilting and collapsing of the narrow parts of the dielectric layer may thus be reduced. From another aspect, the interconnect structure includes a dielectric layer including increased Si—C—Si bonds compared to conventional structures. Accordingly, the depletion of carbon from the dielectric layer is reduced.

In accordance with some embodiments of the present disclosure, a method comprises depositing a dielectric layer over a substrate; etching the dielectric layer to form an opening, wherein a first conductive feature underlying the dielectric layer is exposed to the opening, wherein the dielectric layer is formed using a precursor comprising nitrogen therein; depositing a sacrificial spacer layer extending into the opening; patterning the sacrificial spacer layer, wherein a bottom portion of the sacrificial spacer layer at a bottom of the opening is removed to reveal the first conductive feature, and a first vertical portion of the sacrificial spacer layer in the opening and on sidewalls of the dielectric layer is left to form a first ring; forming a second conductive feature in the opening, wherein the second conductive feature is encircled by the first ring, and is over and electrically coupled to the first conductive feature; and removing at least a portion of the first ring to form an air spacer. In an embodiment, the depositing the dielectric layer comprises depositing a high-k dielectric material.

In an embodiment, the method further comprises forming a metal capping layer over the second conductive feature, wherein the metal capping layer comprises an extension portion extending into the air spacer. In an embodiment, the method further comprises forming a metal capping layer over the second conductive feature, wherein the first ring is removed after the metal capping layer is formed. In an embodiment, the depositing the dielectric layer is performed using a first precursor comprising silicon, carbon, and hydrogen, and a second precursor comprising nitrogen. In an embodiment, the depositing the dielectric layer is performed without using porogen. In an embodiment, the depositing the dielectric layer comprises depositing a lower portion having a first nitrogen atomic percentage; and depositing an upper portion over the lower portion, wherein the upper portion has a second nitrogen atomic percentage different from the first nitrogen atomic percentage.

In an embodiment, the opening comprises a trench and a via opening underlying the trench, and the first ring is in the trench, and the patterning the sacrificial spacer layer leaves a second ring remaining in the via opening. In an embodiment, the method further comprises depositing an etch stop layer over the second conductive feature, wherein at a time after the etch stop layer is deposited, the second ring remains. In an embodiment, the method further comprises forming an additional dielectric layer over the sacrificial spacer layer and sealing the air spacer, wherein a residue portion of the first ring is left underlying the additional dielectric layer. In an embodiment, the first ring is fully removed.

In accordance with some embodiments of the present disclosure, a structure comprises a substrate; a first conductive feature over the substrate; a first etch stop layer over the first conductive feature; a dielectric layer over the first etch stop layer, wherein the dielectric layer comprises nitrogen therein, wherein the dielectric layer comprises a high-k dielectric material; a second conductive feature in the dielectric layer and the first etch stop layer, wherein the second conductive feature is over and contacting the first conductive feature; an air spacer encircling the second conductive feature, wherein sidewalls of the second conductive feature are exposed to the air spacer; and a second etch stop layer over and contacting the dielectric layer, wherein the second etch stop layer is further over the second conductive feature.

In an embodiment, the dielectric layer comprises a top portion and a bottom portion, wherein the top portion has a greater nitrogen atomic percentage than the lower portion. In an embodiment, the air spacer extends from a top surface of the dielectric layer to a bottom surface of the first etch stop layer. In an embodiment, the dielectric layer has a hardness in a range between about 15 GPa and about 35 GPa. In an embodiment, the structure further comprises a dielectric material contacting a sidewall of a bottom portion of the second conductive feature, wherein a top portion of the second conductive feature is exposed to the air spacer, and wherein the dielectric material and the dielectric layer are formed of different materials. In an embodiment, no dielectric material is between the second conductive feature and the air spacer.

In accordance with some embodiments of the present disclosure, a structure comprises a first conductive feature; a second conductive feature over and electrically coupling to the first conductive feature, wherein the second conductive feature comprises a diffusion barrier; and a metallic material in a basin formed by the diffusion barrier; an air spacer encircling a top portion of the second conductive feature; and a dielectric layer encircling the air spacer, wherein the dielectric layer comprises a high-k dielectric material that comprises nitrogen. In an embodiment, the structure further comprises a dielectric material separating a bottom portion of the second conductive feature from the dielectric layer, wherein the dielectric material is directly underlying and exposed to the air spacer. In an embodiment, the dielectric layer has a hardness in a range between about 15 GPa and about 35 GPa.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a dielectric layer over a substrate, wherein the depositing the dielectric layer comprises adjusting a flow rate of a nitrogen-containing precursor, so that the dielectric layer comprises:
    a bottom portion comprising nitrogen and having a constant nitrogen atomic percentage;
    a middle portion having a higher nitrogen atomic percentage than the bottom portion of the dielectric layer; and
    an upper portion having a lower nitrogen atomic percentage than the middle portion of the dielectric layer;
etching the dielectric layer to form an opening, wherein a first conductive feature underlying the dielectric layer is exposed to the opening;
depositing a sacrificial spacer layer extending into the opening;
patterning the sacrificial spacer layer, wherein a bottom portion of the sacrificial spacer layer at a bottom of the opening is removed to reveal the first conductive feature, and a first vertical portion of the sacrificial spacer layer in the opening and on sidewalls of the dielectric layer is left to form a first ring;
forming a second conductive feature in the opening, wherein the second conductive feature is encircled by the first ring, and is over and electrically coupled to the first conductive feature, and wherein the second conductive feature comprises a substantially straight edge extending from a bottom surface level of the bottom portion to a top surface level of the upper portion; and
removing at least a portion of the first ring to form an air spacer.

2. The method of claim 1, wherein the depositing the dielectric layer comprises depositing a high-k dielectric material.

3. The method of claim 1 further comprising forming a metal capping layer over the second conductive feature, wherein an interface between the metal capping layer and the second conductive feature is coplanar with a top surface of the dielectric layer, wherein the metal capping layer comprises an extension portion extending into the air spacer.

4. The method of claim 1 further forming a metal capping layer over the second conductive feature, wherein the first ring is removed after the metal capping layer is formed.

5. The method of claim 1, wherein the depositing the dielectric layer is performed using a first precursor comprising silicon, carbon, and hydrogen, and a second precursor comprising nitrogen.

6. The method of claim 1, wherein the depositing the dielectric layer is performed without using porogen.

7. The method of claim 1 further comprising forming an additional dielectric layer over the sacrificial spacer layer and sealing the air spacer, wherein at a time after the air spacer is formed, a residue portion of the first ring is left underlying the additional dielectric layer.

8. A method comprising:
forming a first conductive feature over a substrate;
depositing a first etch stop layer over the first conductive feature;
depositing a dielectric layer over the first etch stop layer, wherein the dielectric layer comprises nitrogen therein, wherein the depositing the dielectric layer comprises:
    depositing a bottom portion having a first nitrogen atomic percentage;
    depositing a middle portion over the bottom portion, wherein the middle portion has a second nitrogen atomic percentage higher than the first nitrogen atomic percentage; and
    depositing an upper portion over the middle portion, wherein the upper portion has a third nitrogen atomic percentage lower than the second nitrogen atomic percentage;
forming a second conductive feature in the dielectric layer and the first etch stop layer, wherein the second conductive feature is over and contacting the first conductive feature, wherein the second conductive feature is encircled by an air spacer, wherein sidewalls of the second conductive feature are exposed to the air spacer, and wherein the air spacer extends from substantially a bottom surface of the bottom portion to a top surface of the upper portion; and
depositing a second etch stop layer over and contacting the dielectric layer, wherein the second etch stop layer is further over the second conductive feature.

9. The method of claim 8, wherein the depositing the dielectric layer comprises depositing a high-k dielectric material.

10. The method of claim 8, wherein the forming the air spacer comprises:

forming a sacrificial spacer layer, wherein the second conductive feature is formed in a region encircled by the sacrificial spacer layer; and etching to remove first part of the sacrificial spacer layer and to form the air spacer, wherein a top surface of a second part of the sacrificial spacer layer is underlying, and is exposed to, the air spacer.

11. The method of claim 8 further comprising performing a selective deposition process to form a metal cap over the second conductive feature, wherein a portion of the metal cap is at a location lower than a top surface of the second conductive feature.

12. A method comprising:

forming a first conductive feature;

forming a dielectric layer over the first conductive feature, wherein the forming the dielectric layer comprises adjusting a flow rate of a nitrogen-containing precursor, so that a middle portion of the dielectric layer has a higher nitrogen atomic percentage than a respective lower portion of the dielectric layer, and an upper portion of the of the dielectric layer has a lower nitrogen atomic percentage than the middle portion;

forming a second conductive feature over and electrically coupling to the first conductive feature, wherein the second conductive feature comprises:

a diffusion barrier; and a metallic material in a basin formed by the diffusion barrier, wherein the second conductive feature comprises a substantially straight edge extending from a bottom surface level of the lower portion to a top surface level of the upper portion; and forming an air spacer encircling a top portion of the second conductive feature, wherein the air spacer is encircled by the dielectric layer, and wherein the dielectric layer comprises a high-k dielectric material that comprises nitrogen.

13. The method of claim 12, wherein no dielectric material is between the second conductive feature and the air spacer.

14. The method of claim 12, wherein the forming the air spacer comprises removing a sacrificial spacer layer between the dielectric layer and the second conductive feature, and wherein after the removing the sacrificial spacer layer, a residue portion of the sacrificial spacer layer is left.

15. The method of claim 10, wherein before the air spacer is formed, the first part of the sacrificial spacer layer overlaps the second part of the sacrificial spacer layer, with first edges of the first part of the sacrificial spacer layer being vertically aligned to respective second edges of the second part of the sacrificial spacer layer.

16. The method of claim 12, wherein the forming the dielectric layer comprises implanting nitrogen, so that the upper portion has the lower nitrogen atomic percentage than the respective lower portion.

17. The method of claim 8, wherein the depositing the dielectric layer comprises adjusting a flow rate of a nitrogen-containing precursor continuously.

18. The method of claim 1, wherein the the middle portion and the upper portion of the dielectric layer are formed using a same method by adjusting flow rates of same precursors.

19. The method of claim 1, wherein the air spacer extends from the bottom surface level of the bottom portion to the top surface level of the upper portion.

20. The method of claim 8, wherein the second conductive feature comprises a substantially straight edge extending from the bottom surface of the bottom portion to the top surface of the upper portion.

\*   \*   \*   \*   \*